(12) United States Patent
Zhao et al.

(10) Patent No.: US 7,503,027 B1
(45) Date of Patent: Mar. 10, 2009

(54) HARDWARE DESCRIPTION LANGUAGE CODE GENERATION FROM A STATE DIAGRAM

(75) Inventors: Zhihong Zhao, Salem, NH (US); Aditya Agrawal, Cambridge, MA (US); Beth Cockerham, Melrose, MA (US); Vijay Raghavan, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 355 days.

(21) Appl. No.: 11/394,541

(22) Filed: Mar. 31, 2006

(51) Int. Cl.
*G06F 17/50* (2006.01)

(52) U.S. Cl. ................... 716/18; 716/1; 716/11; 716/18

(58) Field of Classification Search ............ 716/1, 716/11, 18
See application file for complete search history.

(56) References Cited

U.S. PATENT DOCUMENTS

2006/0259744 A1* 11/2006 Matthes ............... 712/220
2007/0266329 A1* 11/2007 Gaudette ............... 715/763

* cited by examiner

*Primary Examiner*—Thuan Do
(74) *Attorney, Agent, or Firm*—Lahive & Cockfield, LLP; Kevin J. Canning

(57) ABSTRACT

The present invention provides a state diagramming environment in a computing device that enables the conversion of a state diagram into a hardware description language. To achieve this conversion, the present invention generates an intermediate representation of the state diagram. The intermediate representation is checked against a set of predefined restrictions for compliance. The state diagramming environment converts the intermediate representation of the state diagram into a hardware description language, such as VHDL or Verilog.

24 Claims, 17 Drawing Sheets

HARDWARE DESCRIPTION LANGUAGE CODE GENERATION FROM A STATE DIAGRAM

FIELD OF THE INVENTION

The present invention relates to hardware description language code generation from a state diagram.

BACKGROUND

State diagramming environments provide design tools for modeling and simulating event-driven systems and subsystems. State diagrams enable the graphical representation of hierarchical and parallel states and the event driven transitions between them. The state diagrams include both logic and internal data. State diagrams can be used to visually detect a current state during the operation of the system being modeled. An example of a state diagramming environment is Stateflow® from The Math Works, Inc. of Natick, Mass.

A state diagram may be used to represent finite state machines. In hardware design, a circuit with memory constitutes a finite state machine. Finite state machines may be used in the design of sequential circuits, which in general, are circuits that use combinational logic and a memory component. The output and next state of a sequential circuit may be a function of the present state of and/or the input to the sequential circuit. Sequential circuits fall into two categories, asynchronous and synchronous. Asynchronous sequential circuits refer to circuits that do not use a clock to synchronize state transitions. Synchronous sequential circuits refer to sequential circuits that use a clock to synchronize state transitions.

Many hardware designers use a hardware description language, such as VHDL or Verilog, to design sequential circuits. Hardware description languages provide a formal description of a circuit. Unlike high level programming languages, such as C or C++, hardware description languages use syntax and semantics for expressing time and concurrent statements, which are primary attributes of hardware.

For example, an expression of time using a statement in VHDL may be:

Clock<=not Clock after 1 ms;

This statement creates a periodic signal that has a period of 2 milliseconds. That is, the value of "not Clock" is assigned to "Clock" after every millisecond. So if Clock is initially 0, after 1 millisecond, not Clock is assigned to Clock, where not Clock is 1. Therefore, Clock is now 1, and after another millisecond, not Clock is again assigned to Clock making Clock 0.

An example of concurrent statements using VHDL are:

$A<=B+C;$ $D<=E+F;$

The value of A may change any time values B and C change. Likewise the value of D may change any time values E and F change. Further, the order in which the concurrent statements are listed does not affect when they are evaluated. In this manner, hardware description languages are unlike a sequential program that uses a programming language such as C or C++.

A benefit of hardware description languages is that a hardware design using a hardware description language can simulate their design in software before implementing the design in hardware. This ability allows hardware designers to verify their design before implementing the design, and thereby, saves time by reducing the number of iterations needed to implement the design and also provides a cost reduction.

Despite the benefit of hardware description languages, using a hardware description language for hardware design is often complicated and time consuming as compared to using a state diagram. There is a need for the ability to convert a state diagram into a hardware description language suitable for synthesizing and implementing a hardware design. It is also desired that given the ability to convert from a state diagram to a hardware description language that a simulation of the state diagram yield the same result as a simulation of the hardware description language that represents the state diagram.

SUMMARY OF THE INVENTION

The present invention addresses the above identified issues by providing a state diagramming environment in a computing device that enables the conversion of a state diagram into a hardware description language. To achieve this conversion, embodiments of the present invention generate at least one intermediate representation of the state diagram that is converted into a hardware description language, such as VHDL or Verilog. Embodiments of the present invention allow the state diagram's syntax and semantics to be mapped to the hardware description language's syntax and semantics. Further, embodiments of the present invention implement a set of restrictions that enable bit-true compatibility between the hardware description language representation of the state diagram and the state diagram.

In one aspect of the present invention, a method for use with a state diagramming environment in a computing device is disclosed. The method includes the steps of providing a state diagram in the state diagramming environment, and generating an intermediate representation of the state diagram. The method further provides the step of converting the intermediate representation of the state diagram into a hardware description language representation.

In another aspect of the present invention, a system in a computing device with a state diagramming environment is disclosed. The system provides a state diagram in the state diagramming environment, and an intermediate representation that is generated based on the state diagram. The system further provides that the intermediate representation of the state diagram is convertible into a hardware description language, and that a converter converts the intermediate representation into the hardware description language.

In another aspect of the present invention, a medium that holds instructions for performing steps that are executable with a computing device is disclosed. The instructions for performing enables the steps of providing a state diagram in a state diagramming environment, and generating an intermediate representation of the state diagram. The instructions for performing, further enabling the step of converting the intermediate representation of the state diagram into a hardware description language representation.

In yet another aspect of the present invention, a method for use with a state diagramming environment in a computing device is disclosed. The method includes the steps of providing a state diagram and semantics of the state diagram, and generating an intermediate representation of the state diagram. The method further provides the step of restricting the semantics of the state diagram to enable a specific mapping of the semantics of the state diagram to semantics of a hardware description language. The method further provides the step of generating code in a hardware description language based on the specific mapping of the semantics of the state diagram to the semantics of the hardware description language using a control flow based intermediate representation.

In another aspect of the present invention, a medium that holds instructions for performing steps that are executable with a computing device is disclosed. The instructions for performing enable the steps of providing a state diagram and semantics of the state diagram, and generating an intermediate representation of the state diagram. The instructions for performing further provide the step of restricting the semantics of the state diagram to enable a specific mapping of the semantics of the state diagram to semantics of a hardware description language. The instructions for performing further provide the step of generating code in a hardware description language based on the specific mapping of the semantics of the state diagram to the semantics of the hardware description language using a control flow based intermediate representation.

BRIEF DESCRIPTION OF THE DRAWINGS

The invention is described with particularity in the appended claims. The advantages of the invention summarized above, as well as further advantages of the invention, may be better understood by reference to the following description taken in conjunction with the accompanying drawings, in which:

DETAILED DESCRIPTION

Certain embodiments of the present invention are described below. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The illustrative embodiment of the present invention enables the conversion of a state diagram in a state diagramming environment into a hardware description language. The state diagramming environment allows a user to develop a state diagram for a finite state machine that represents a hardware design. An example of a state diagramming environment is Stateflow® from The Mathworks, Inc of Natick, Mass. Those skilled in the art will recognize that the present invention may also be practiced with other state diagramming environments.

In the illustrative embodiment, a state diagram is processed to generate a hardware description language representation of the state diagram. The state diagramming environment generates an intermediate representation from the state diagram. To do this, the illustrative embodiment of the present invention parses the state diagram into syntactical components and uses the syntactical components to construct the intermediate representation such that the intermediate representation represents the semantics of the state diagram. The intermediate representation is transformed into a hardware description language specific intermediate representation. The hardware description language specific intermediate representation is converted into a hardware description language representation of the state diagram. The conversion to the hardware description language replaces syntax of the hardware description language specific intermediate representation with a hardware description language specific syntax, and generates a hardware description language code that is representative of the state diagram by mapping the syntax and semantics of the intermediate representation to the syntax and semantics of the hardware description language. To ensure bit-true compatibility between the generated hardware description language representation of the state diagram and the state diagram a set of restrictions are enforced. The illustrative embodiment therefore provides a hardware designer with the ability to design hardware using a state diagram that may be converted into a hardware description language that allows the hardware designer to implement the hardware design.

Figure 1:
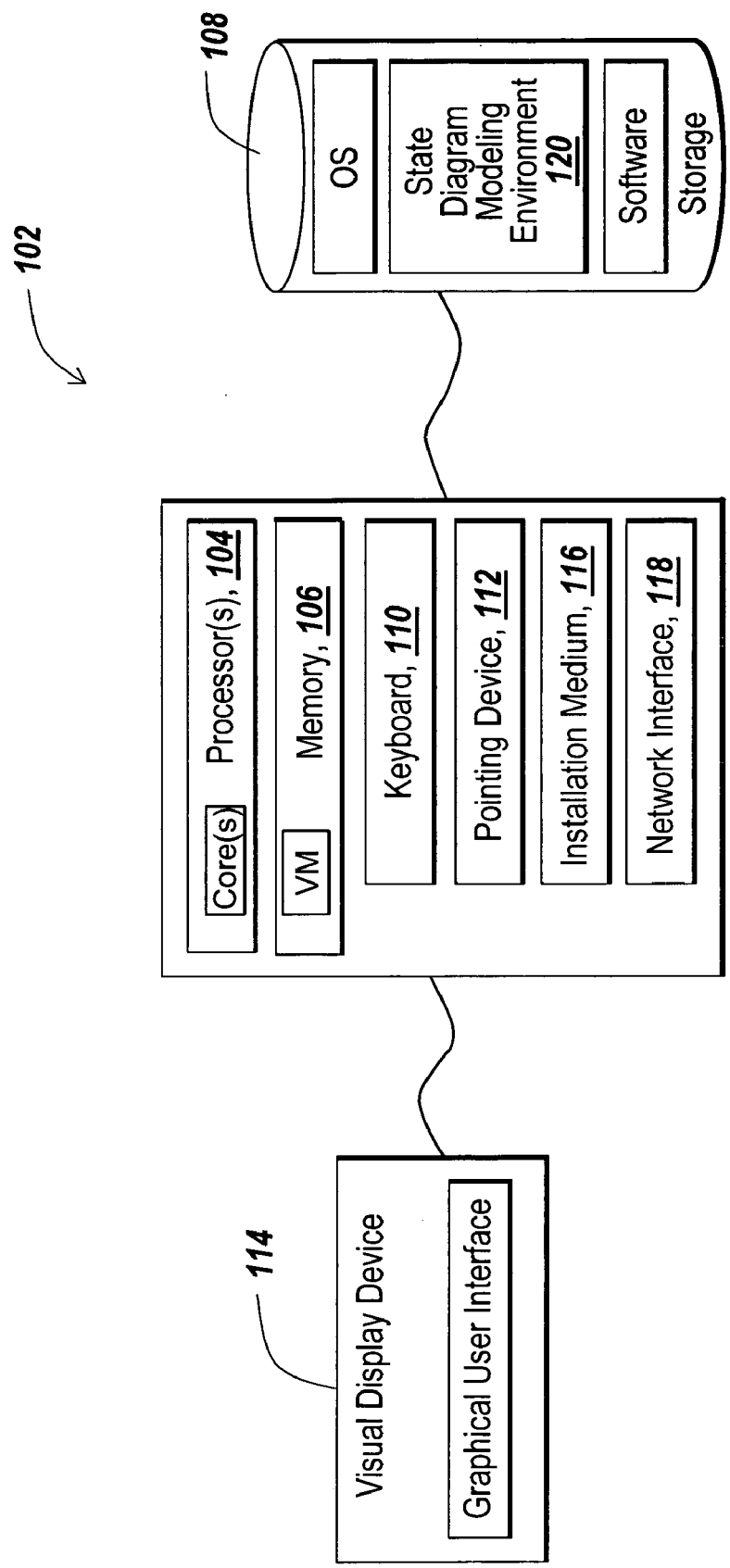
FIG. 1 is a block diagram of an illustrative computing device for practicing an embodiment of the present invention.

FIG. 1 depicts an environment suitable for practicing an illustrative embodiment of the present invention. The environment includes a computing device 102 having memory 106, on which software according to one embodiment of the present invention may be stored, a processor (CPU) 104 for executing software stored in the memory 106, and other programs for controlling system hardware. A user may interact with the computing device 102 through a visual display device 114 such as a computer monitor, which may be used to display a graphical user interface (GUI). The computing device 102 may include other I/O devices such as a keyboard 110 and a pointing device 112, for example a mouse, for receiving input from a user. The computing device 102 may include other suitable conventional I/O peripherals. The computing device 102 may further comprise a storage device 108, such as a hard-drive, for storing an operating system and other related software. A state diagramming environment 120 may comprise of software that resides on storage device 108.

Optionally, the computing device 102 may include multiple CPUs for executing software loaded in the memory 106, and other programs for controlling system hardware. Each of the CPUs can be a single or multiple core processor. The code loaded in the memory 106 may run in a virtualized environment, such as in a Virtual Machine (VM). Multiple VM's may be resident on a single processor. Also, part of the application could be run in hardware, for example, by configuring a field programmable gate array (FPGA) or creating an application specific integrated circuit (ASIC). Further, the part of the applications may be run on analog electronic devices or other resources may be used to run part of the application, such as graphics processing units (GPUs).

Network interface 118 may be used to interface computing device 102 to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM). In addition the network may use middleware, such as CORBA or DCOM to allow a computer on the network to communicate directly with a device located on another computer that is connected to the network. The computing device 102 may be any computer system such as a personal computer, workstation, desktop computer, server, laptop, handheld computer or other form of computing or telecommunications device that is capable of communication and that has sufficient processor power and memory capacity to perform the operations described herein.

Figure 2A:
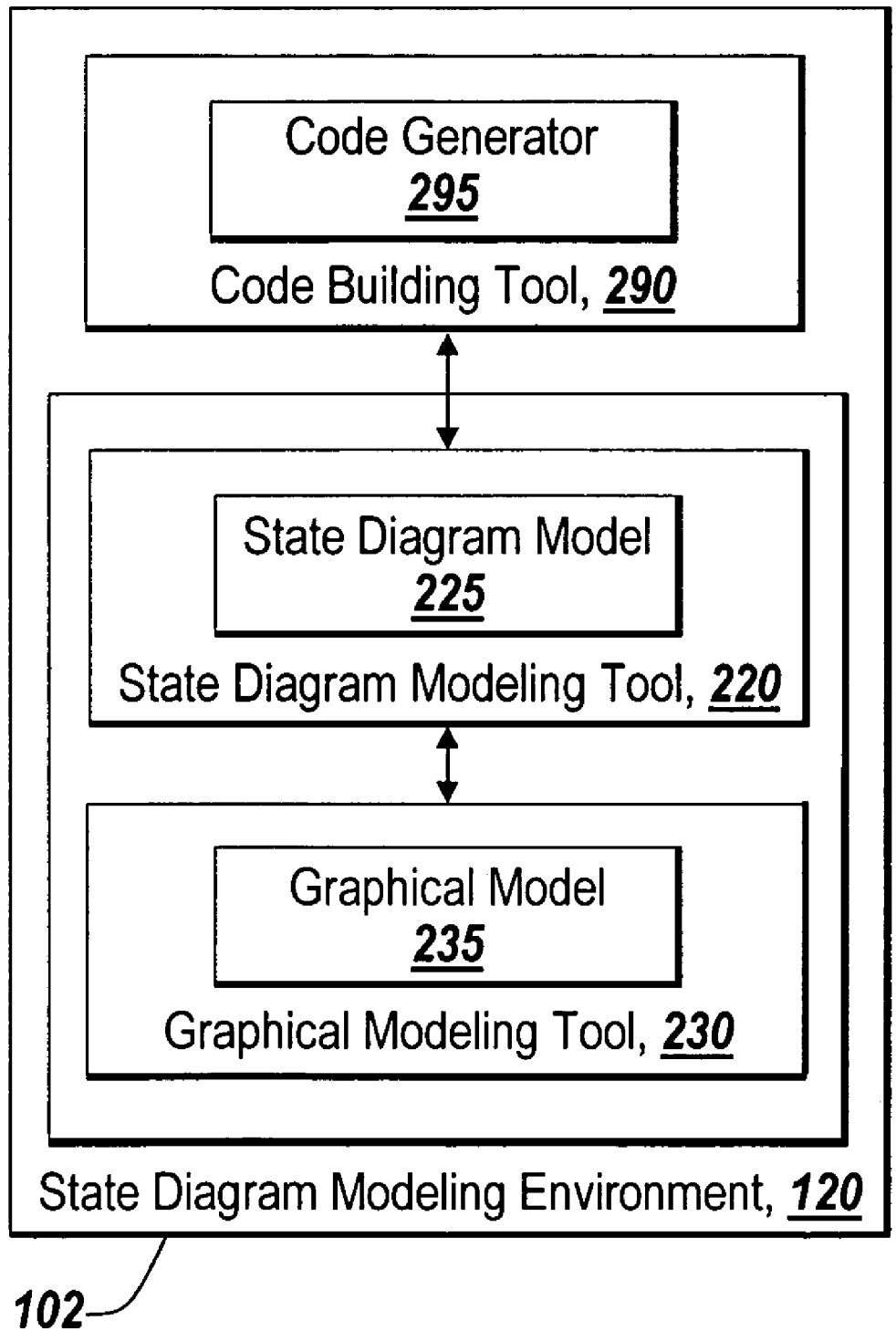
FIG. 2A is a block diagram of an illustrative state diagramming environment for practicing an embodiment of the present invention on the computing device of FIG. 1.

In one aspect, the present invention is related to a state diagramming environment 120 as illustrated in FIG. 2A. The state diagramming environment 120 may include a state diagram modeling tool 220, a graphical modeling tool 230, and a code building tool 290. The state diagram modeling tool 230 provides an environment for the design, development, testing, simulation, and execution of a state diagram model 225. The graphical modeling tool 230 provides an environment for the design, development, testing, simulation, and execution of a graphical model 235, such as a block diagram model. An element of the graphical model 235 may be a state diagram model 225. One of ordinary skill in the art would recognize that the graphical modeling tool 230 is not necessary to carry out the operation of the illustrative embodiment.

The code building tool 290 of the state diagramming environment may include a code generator 295 to provide for the code generation and building of executable forms of the state diagram model 225 and/or graphical model 235. The state diagram modeling tool 220 may be in communication with the graphical modeling tool 230 via any suitable type and form of interface. The code building tool 290 may be in communication with or otherwise have any suitable type and form of interface to the state diagram modeling tool 220 and/or the graphical modeling tool 230.

The illustrative state diagram modeling tool 220 of the present invention comprises a design and development environment for creating any type and/or form of state diagram model 225, which may also be referred to as a state machine diagram model, a state transition diagram, a state transition table, a state diagram, a statechart or chart. In an exemplary embodiment and by way of example, the state diagram modeling tool 220 may comprise Stateflow® by The MathWorks, Inc. of Natick, Mass. In the exemplary embodiment of Stateflow®, the state diagram model 225 may be referred to as a Stateflow chart. Stateflow® integrates with graphical modeling tools, such as Simulink® by The MathWorks, Inc. of Natick, Mass., to model, simulate, and analyze systems. In one embodiment, Stateflow® provides for the design and development of deterministic, supervisory control systems in a graphical environment. The state diagram modeling tool 220 provides for state machine representation, flow diagram notations, and state-transition diagrams all in the same diagram model 225.

A state diagram model 225 may comprise a graphical representation of a state machine, such as an infinite state machine, a finite state machine or a non-deterministic state machine, where states and transitions form the building blocks of a system. As known to those ordinarily skilled in the art, a state machine is a representation of an event-driven system where the system makes a transition from one state to another state provided any conditions associated with the transition are met. A state may be a mode of behavior that can be either active or inactive based on inputs, outputs, transitions, and conditions. A transition links one state to another state and may have a condition, such as any logic, computation, algorithm, or executable instruction, used to determine if and when a transition between states may occur.

In some embodiments of the state diagram model 225, any of the states may be specified to have either a parallel (AND) or an exclusive (OR) decomposition with respect to any sub-states associated with a state, such as in the illustrative embodiment of Stateflow® as the state diagram modeling tool 220. A state with a parallel decomposition may comprise one or more sub-states that are active at the same time when the state is active and/or another sub-state is active. For example, one or more selected sub-states may be active in parallel or at the same time when the state is active. A state with an exclusive decomposition may comprise only one sub-state that is active when the state is active. One ordinarily skilled in the art will recognize and appreciate how states and sub-states may be specified or configured to operate in a parallel or exclusive manner.

In another embodiment of the present invention, a truth table, graphical or otherwise, may be used to represent the relationships between inputs, outputs, states, transitions, and conditions of a finite state machine. Although generally discussed herein as a graphical state diagram model, one ordinarily skilled in the art will recognize and appreciate that any type of graphical or non-graphical state model may be used and that any type of state machine, such as a finite, non-deterministic, or a virtual state machine may be used in practicing the present invention. An example of a non-graphical state machine is a state machine that is implemented using embedded MATLAB®. Embedded MATLAB® provides textual language that may be used to implement a state diagram model. Additionally, the state diagram modeling tool 220 and/or state diagram model 225 may use any type and/or form of notation for state machine representation, such as any notation known by those ordinarily skilled in the art, or any notation suitable for practicing the operations of the present invention.

The state diagram modeling tool 220 may arrange state diagram objects in a hierarchy of state diagram objects. One object can contain other objects. The object hierarchy for all state diagram objects defines which objects a particular object can contain in a state diagram model 225.

The highest object in the hierarchy of the state diagram model 225 is a machine. It is defined as an object that contains all other state diagram objects. This means that the machine contains all the state diagrams of a state diagram model. In addition, the machine for a model can also contain its own data, event, and target objects. The data, events and target object specified by the machine are referred as being machine-parented.

State diagrams may contain, but are not limited to the following objects states, boxes, functions, data, events, transitions, junctions, and events. Any combination of these objects may create a state diagram. The hierarchy of the state diagram model 225 may further provide that states can contain all of these objects as well, including other states.

The state diagram modeling tool 220 may provide elements such as states, junctions, and functions, such as graphical functions of Simulink® and/or Stateflow®, that may be placed and arranged graphically in a window, design area or otherwise collectively in a state diagram model 225. States and junctions may be connected together in the state diagram model 225 to form flows and transitions for an implementation of a state machine. The state diagram modeling tool 220 and/or state diagram model 225 may provide for parallelism in that two or more orthogonal states may be active at the same time. Additionally, the state diagram modeling tool 220 and/or state diagram model 225 may provide a mechanism for specifying transitions and/or conditions based on historical information related to execution of the state diagram model 225. Additionally, the state diagram modeling tool 220 and/or state diagram model 225 may use any type and/or form of graphical element to visually represent elements, such as for state machine representation, in a state machine diagram model 225

Although the state diagram modeling tool 220 is generally discussed in view of Stateflow®, one ordinarily skilled in the art will recognize and appreciate the various forms and types of state diagram modeling tools that may be used in practicing the operations of the present invention as described herein. Some examples of state diagram modeling tools that may be, for example, event modeling and simulation tools manufactured by Imagine That, Inc. of San Jose, Calif., or Simul8 Corporation of Boston, Mass., Statemate and Rhapsody from iLogix, Inc. of Toronto, Canada and DYMOLA from Dynasim AB of Lund, Sweden, a mixed-block diagram/statechart modeling and simulation environment such as SIMPLORER from Ansoft Corporation of Pittsburgh, Pa., a data flow diagram environment or a UML modeling environment. Additionally, one skilled in the art would recognize that Petri net modeling tools and Petri Net representations may be used in accordance with the illustrative embodiment of the present invention.

Additionally, in some embodiments, the state diagram modeling tool 220 may be able to execute the state diagram model 225. For example, in the exemplary embodiment of Stateflow®, the state diagram modeling tool 220 has a graphical execution and debugging environment that provides a user control of the simulation execution of the state diagram model 225, and access to debug related tasks, such as setting breakpoints. Additionally, the state diagram modeling tool 220 may display information about the state machine, such as active and inactive states during execution or other information as requested or desired by the user.

In some embodiments, the state diagram modeling tool 220 is included in, integrated with, or is otherwise associated with a graphical modeling tool 230. The graphical modeling tool 230 of the present invention provides a graphical modeling environment for creating, designing, simulating, testing, and verifying a graphical model 235, such as a block diagram model. In an exemplary embodiment, the graphical modeling tool 230 includes the graphical modeling environment of Simulink® from the MathWorks, Inc. of Natick, Mass. In the graphical modeling tool 230, configurable and customizable functional blocks are used to create block diagram models that may represent a design, or algorithm, for a control system, a signal processing system, a communication system, any other time-varying or dynamic system or any computational hardware device. In other embodiments, the state diagram modeling tool 220 is separate from the graphical modeling tool 230 and may be otherwise interfaced or in communication with the graphical modeling tool 230.

The code building tool 290 may generate code of executable instructions representing the state diagram model 225 to compile and build for executing on a target hardware platform and/or operating system. As such, the state diagram model 225 can be processed into an executable form to simulate, run, implement or otherwise execute the design, functionality, and/or operations represented by the state diagram model 225. An executable implementation of the state diagram model 225 may be a hardware description language, such as VHDL or Verilog. VHDL and Verilog describe a hardware design textually and allow for synthesis and implementation of the hardware design.

The state diagram modeling environment 120 may include code building tool 290 for generating code and building an executable form of the graphical model 235 and/or state diagram model 225. The code building tool 290 comprises a code generator 295, such as the automatic code generator of Real-Time Workshop® from The MathWorks, Inc. of Natick, Mass. The code generator 295 generates source code from a graphical model 235 and/or state diagram model 225 to translate the functionality of the graphical model 235 and/or state diagram model 225 into a program that may be designed to run on any processor, operating system, or otherwise customized to run on a specific target hardware platform. Further in accordance with the illustrative embodiment, the code building tool 290 may translate the graphical model 235 and/or state diagram model 220 into a hardware description language.

In FIG. 2A, although the state diagram modeling tool 220, graphical modeling tool 230, and code building tool 290 are illustrated as separate tools, one ordinarily skilled in the art will recognize and appreciate that any combination or all of these tools 220, 230 and 290 may be combined into a single application, or otherwise tightly integrated to present a single application in performing the operations of the present invention as described.

Figure 2B:
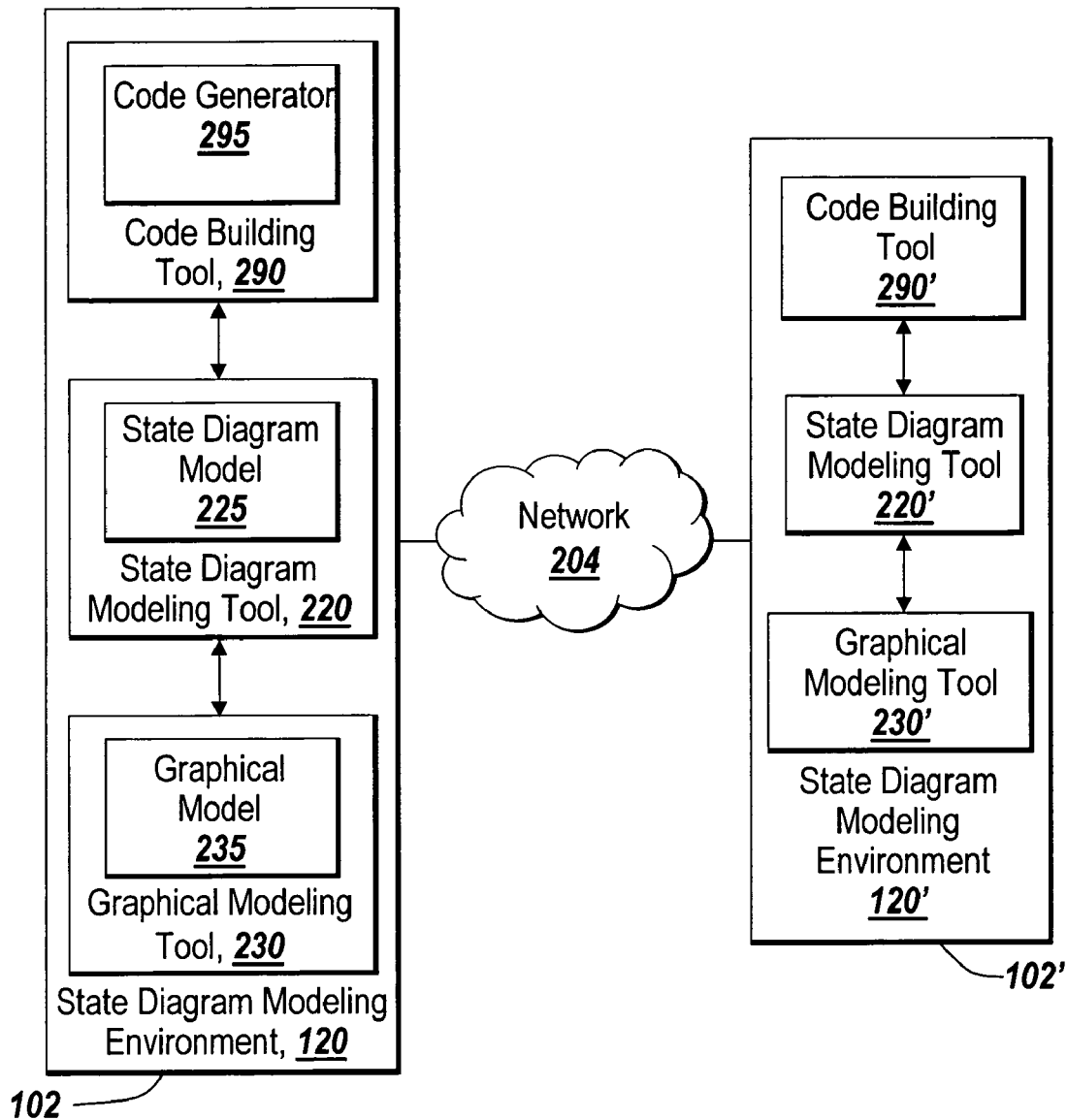
FIG. 2B is a block diagram of another illustrative state diagramming environment for practicing an embodiment of the present invention in a distributed environment.

FIG. 2B depicts another illustrative environment of an embodiment of the present invention, wherein portions of the present invention are practiced in a distributed network environment. The illustrative state diagram modeling environment 120 of the present invention includes a client computing device 102 connected to and in communication with a server computing device 102' over a network 204. The state diagram modeling tool 220, graphical modeling tool 230 and/or code building tool 290, can be capable of and configured to have respective portions run on each of the client 102 and the server 102'. In one embodiment, the state diagram modeling tool 220 may have a first portion running on the client 102 and a second portion 220' running on the server 102'. For example, the state diagram modeling tool 220 may have a client portion 220 on the client 102 for providing and displaying the state diagram model 225, and a server portion 220' on the server 102' that may include application functionality and other processing, such as storing and/or retrieving portions of the state diagram model 225 from a database. Likewise, in other embodiments, the graphical modeling tool 230 may also have a client portion 230 and a server portion 230', and the code building tool 290, a client portion 290 and a server portion 290'. One ordinarily skilled in the art will recognize and appreciate how the state diagram modeling tool 220, graphical modeling tool 230, and/or code building tool 290 may be capable of and configured to execute with a client portion and a server portion in a client/server architecture.

In summary, the state diagram modeling tool 220, graphical modeling tool 230, and code building tool 290 may be deployed across a wide range of different computing devices, different operating systems, and different processors. Furthermore, the state diagram modeling tool 220, graphical modeling tool 230, and code building tool 290, may be deployed in various distributed network environments with various network topologies and configurations.

Figure 3A:
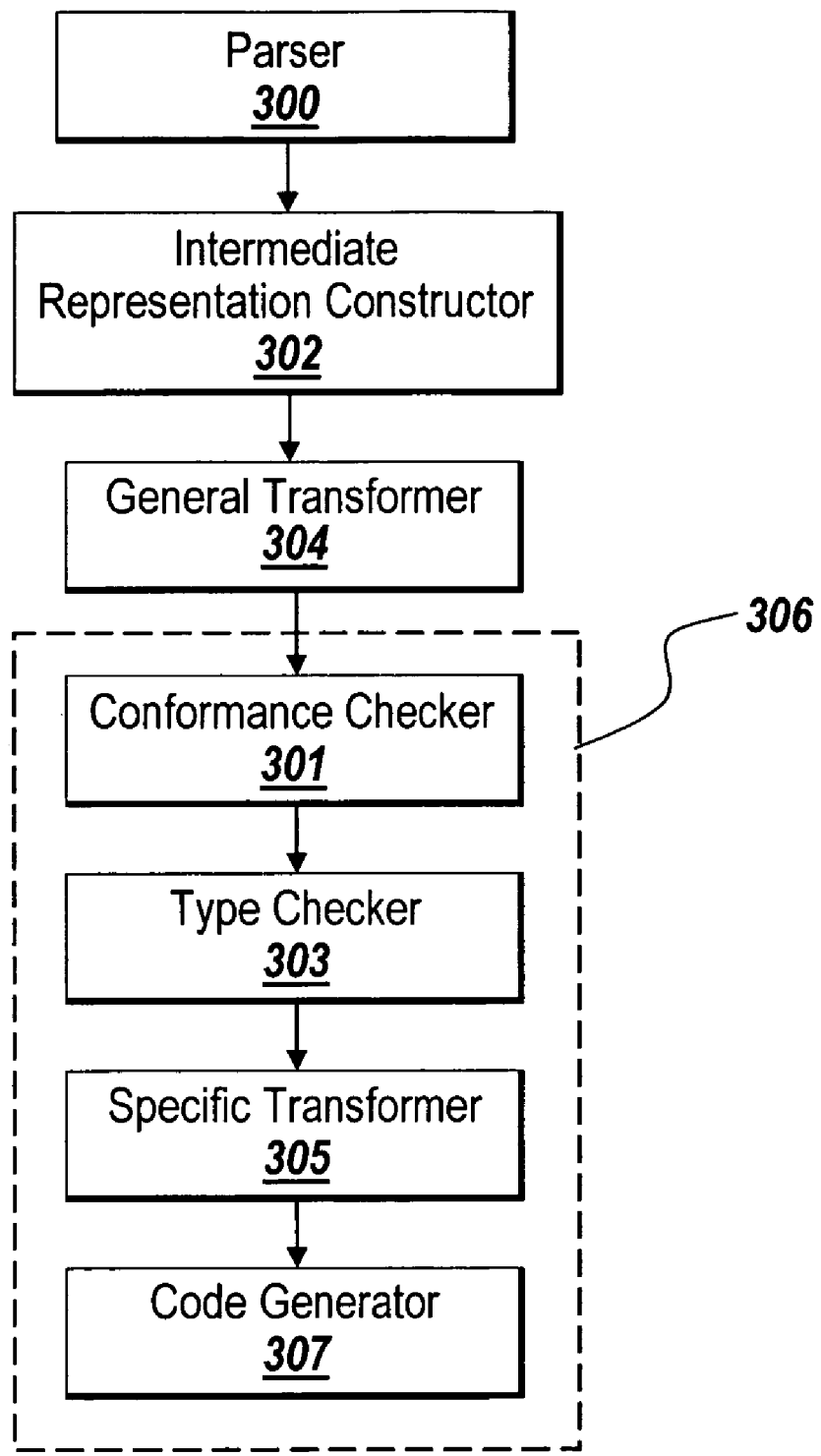
FIG. 3A depicts a flow chart of the components of the code generation process provided by the illustrative embodiment.
Figure 3B:
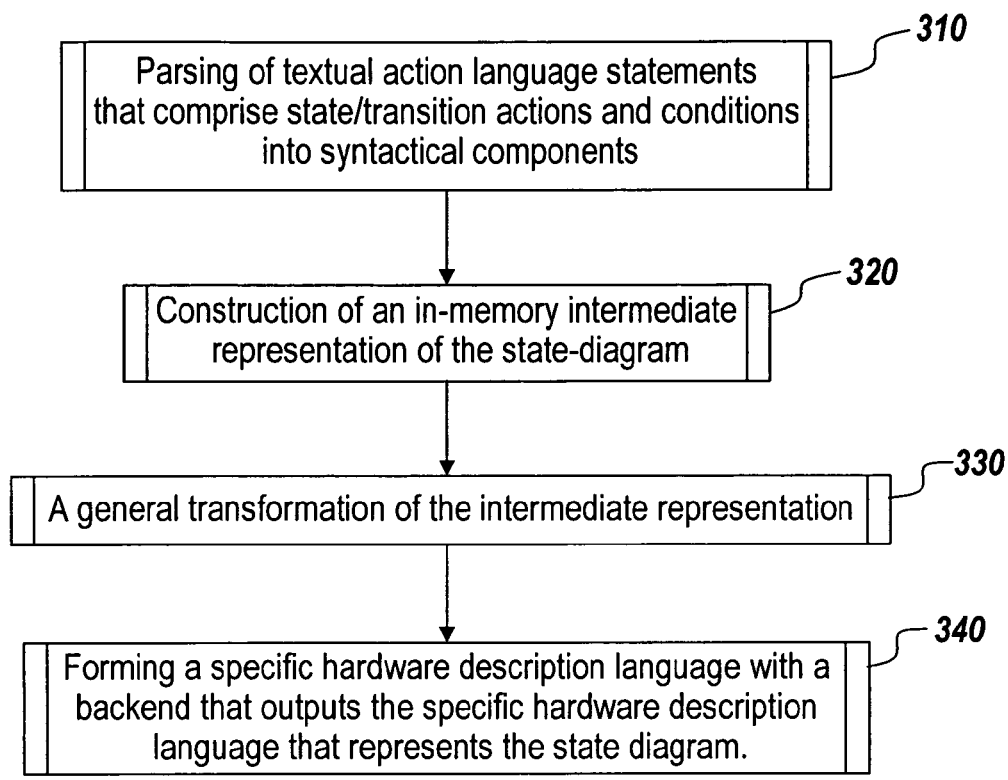
FIG. 3B depicts a flow chart of the phases of the code generation process provided by the illustrative embodiment.
Figure 3C:
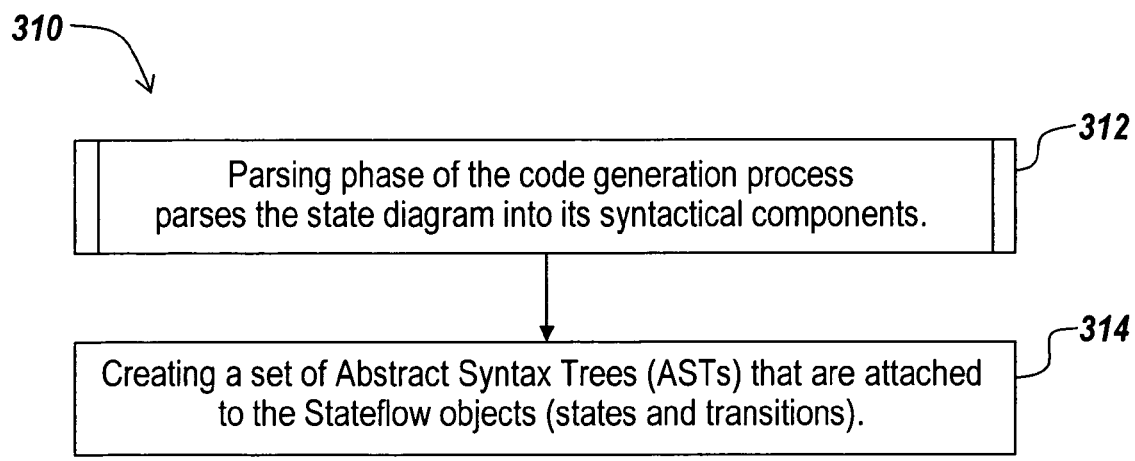
FIG. 3C depicts a more detailed flow chart of the parsing process provided by the illustrative embodiment.
Figure 3D:
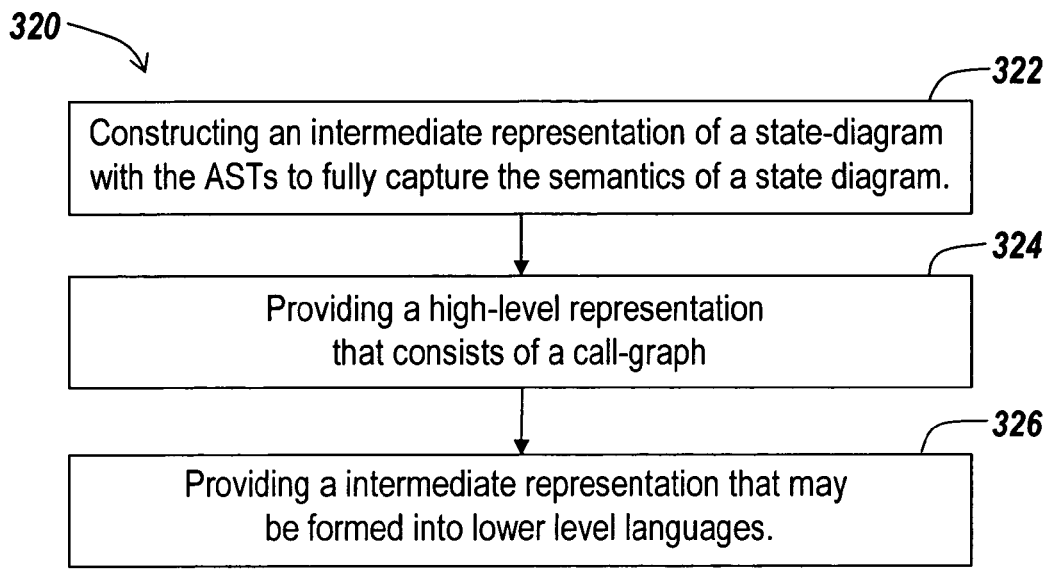
FIG. 3D depicts a more detailed flow chart of the intermediate representation construction process provided by the illustrative embodiment.
Figure 3E:
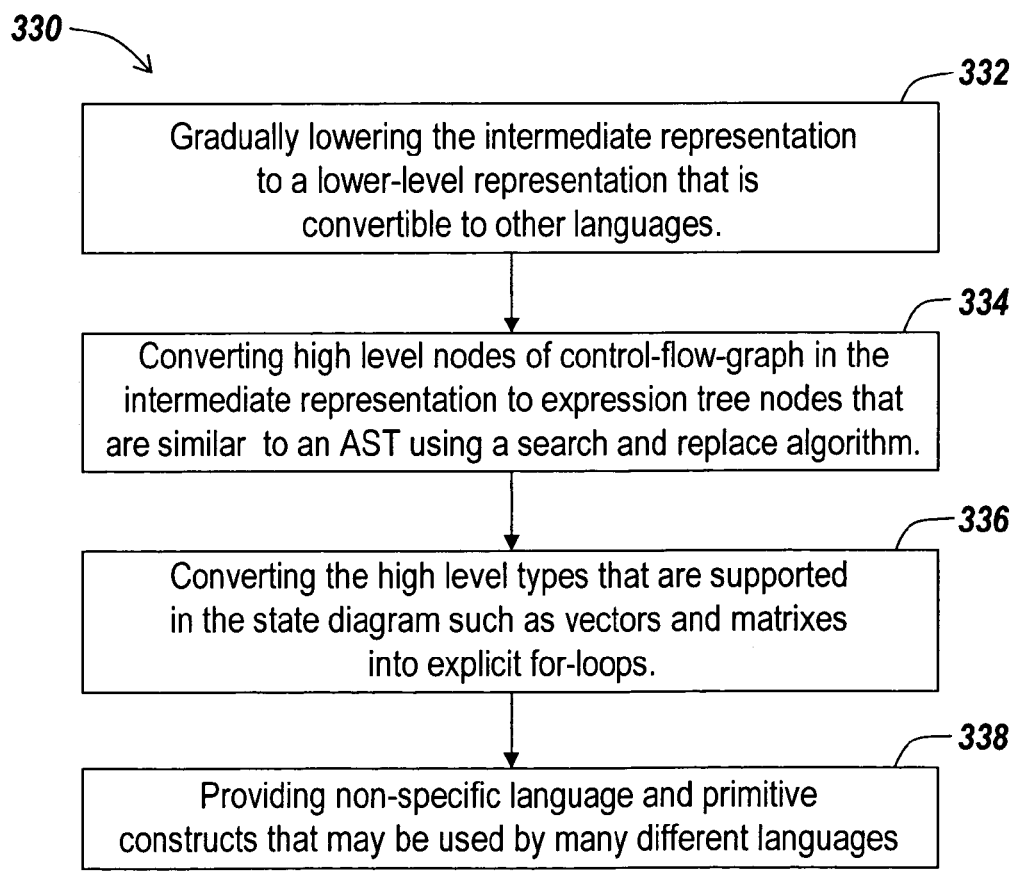
FIG. 3E depicts a more detailed flow chart of the general transformation process provided by the illustrative embodiment.
Figure 3F:
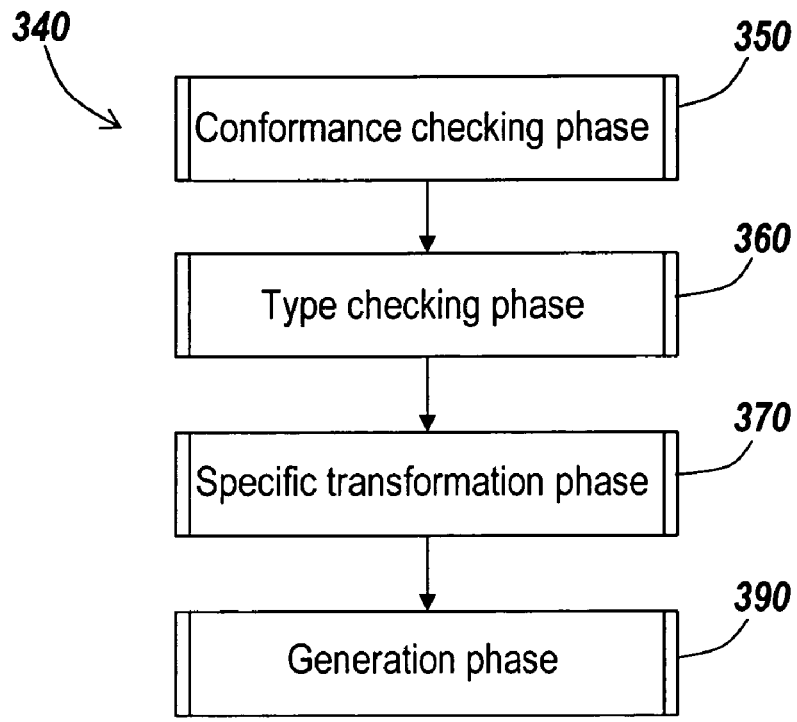
FIG. 3F depicts a more detailed flow chart of the backend of FIG. 3A.
Figure 3G:
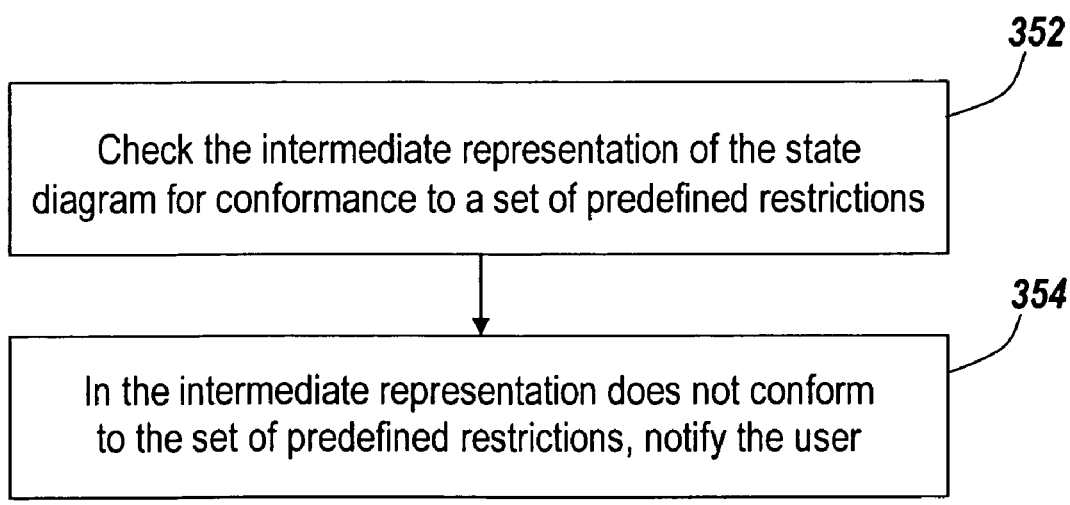
FIG. 3G depicts a more detailed flow chart of the conformance checking phase of the illustrative embodiment.
Figure 3H:
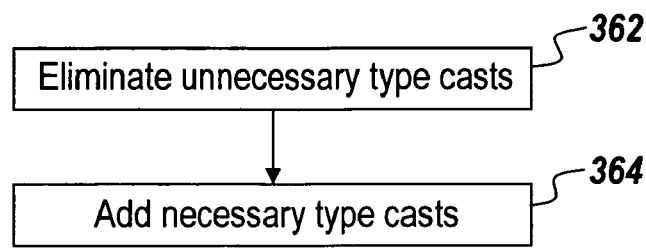
FIG. 3H depicts a more detailed flow chart of the type checking phase of the illustrative embodiment.
Figure 3I:
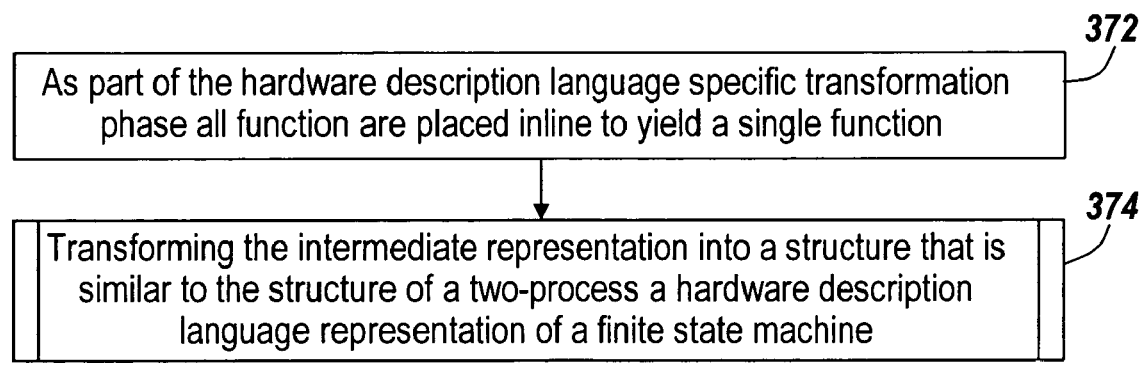
FIG. 3I depicts a more detailed flow diagram of the specific transformation phase provided by the illustrative embodiment.
Figure 3J:
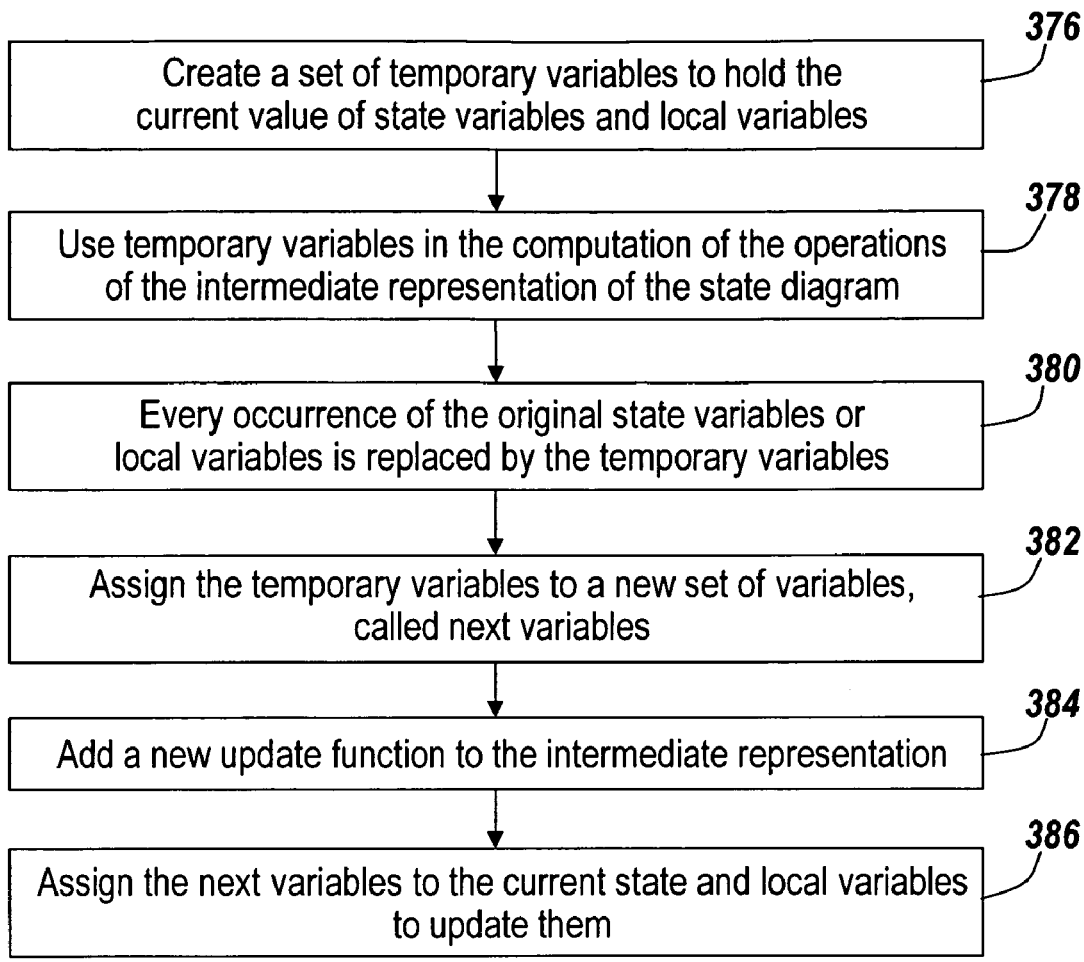
FIG. 3J depicts a more detailed flow chart of step 374 of the specific transformation process provided by the illustrative embodiment.
Figure 3K:
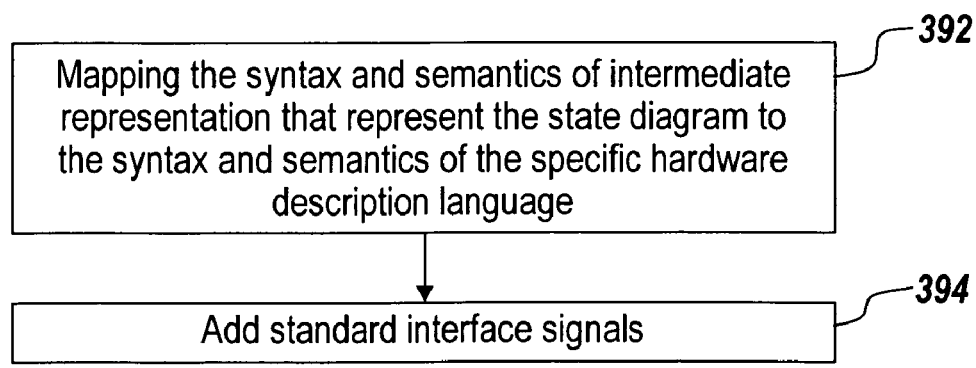
FIG. 3K depicts a more detailed flow chart of the generation phase provided by the illustrative embodiment.

As discussed above, the illustrative embodiment of the present invention provides automatic code generation that generates code in an efficient manner. For example, in a Stateflow® state diagramming environment, the Stateflow® code-generation process is essentially a compilation process that transforms a high-level representation of a Stateflow® state diagram into a hardware description language. To convert a state diagram into a specific hardware description language representation of the state diagram the illustrative embodiment of the present invention may provide, as depicted in FIG. 3A, a parser 300, an intermediate representation constructor ("constructor") 302, a general transformer 304 and a backend 306. The backend 306 may include several components, as depicted in FIG. 3A, including a conformance checker 301, a type checker 303, a specific transformer 305 and a code generator 307. The above components of the illustrative embodiment of the present invention are discussed in relation to the phases the illustrative embodiment of the present invention uses for the code generation process.

FIGS. 3B-K provide flow diagrams for the code generation process. This process includes four phases, parsing of textual action language statements in the state diagram that comprise state/transition actions and conditions using the parser 300 ("parsing phase") (Step 310), construction of an in-memory intermediate representation of the state-diagram using the constructor 302 ("construction phase") (Step 320), a general transformation of the intermediate representation using the general transformer 304 ("general transformation phase") (Step 330), and a backend phase that outputs a hardware description language that represents the state diagram using the backend 306 ("backend phase") (Step 340).

Figure 7:
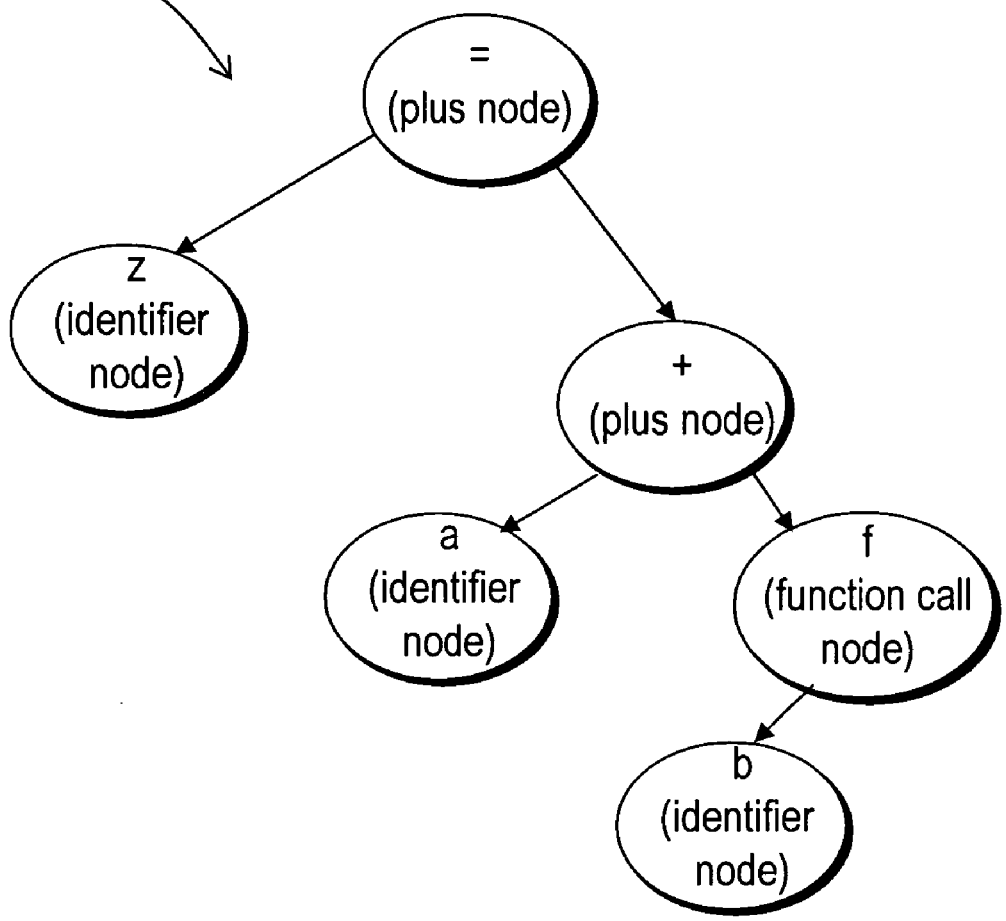
FIG. 7 is an example of an abstract syntax tree (AST) that may be generated from the parser of the illustrative embodiment.

The parsing phase of the code generation process evaluates the graphical and non-graphical objects in the state diagram against the supported state diagram notation and the syntax and pares the state diagram into its syntactical components (Step 312). In this manner, the process provides parsing of textual action language statements that comprise state/transition actions and conditions to create a set of Abstract Syntax Trees (ASTs) that are attached to the Stateflow objects (states and transitions) (Step 314). An AST may include nodes that represent the syntax of the state diagram. As such, an AST provides a hierarchical structure of the syntax using nodes. Nodes of an AST may be connected by edges. FIG. 7 depicts an example of an AST 720 for a single expression 710 that may be found in a state diagram. The AST breaks expression 710 into nodes of the AST 720.

The construction phase of the code generation process constructs an in-memory intermediate representation of the state-diagram using the ASTs to fully capture the semantics of the state diagram (Step 322). The output of this stage is a high-level representation that consists of a call-graph of functions (which contain control-flow graphs consisting of nodes and edges) and high-level nodes, operators, and types to account for matrix, complex and fixed-point quantities that arise from the front-end languages (e.g.: Stateflow and Embedded MATLAB) (Step 324). Each control flow graph represents a function provided by the state diagram. An example of a control flow graph of an intermediate representation is discussed below in relation to FIG. 5. This high-level representation provides an intermediate representation that may be formed into lower level languages (Step 326).

While the illustrative embodiment of the present invention creates a single intermediate representation, one skilled in the art would recognize that several intermediate representations may be constructed from a preliminary intermediate representation, where each intermediate representation may be used for a different purpose. For example, an intermediate representation can be constructed from a preliminary intermediate representation for the purpose of creating source code in a programming language, while another intermediate representation may be constructed from a preliminary intermediate representation for the purpose of creating a hardware description language. Further, an intermediate representation may be generated that may be used to prove certain properties of the state diagram. For example, an intermediate representation may be generated to prove that a certain state can only be reached under certain conditions or that a certain state may never be reached.

The general transformation phase of the code generation process gradually lowers this intermediate representation to a lower-level representation that is convertible to other languages, such as C, C++ or a hardware description language such as VHDL or Verilog (Step 332). As part of the general transformation phase, high level nodes of a control-flow graph in the intermediate representation are converted to expression tree nodes that are similar to an AST using a search and replace algorithm (Step 334). This phase further provides converting the high level types that are supported in the state diagram such as vectors and matrixes into explicit for-loops (Step 336). Converting these high level types into explicit for-loops allows the intermediate representation to be used for programming languages and hardware description languages that do not support these high level types. The result of the general transformation phase in the code generation process is an intermediate representation that provides non-specific language and primitive constructs that may be used by many different languages, such as C, C++, VHDL or Verilog (Step 338).

Figure 5:
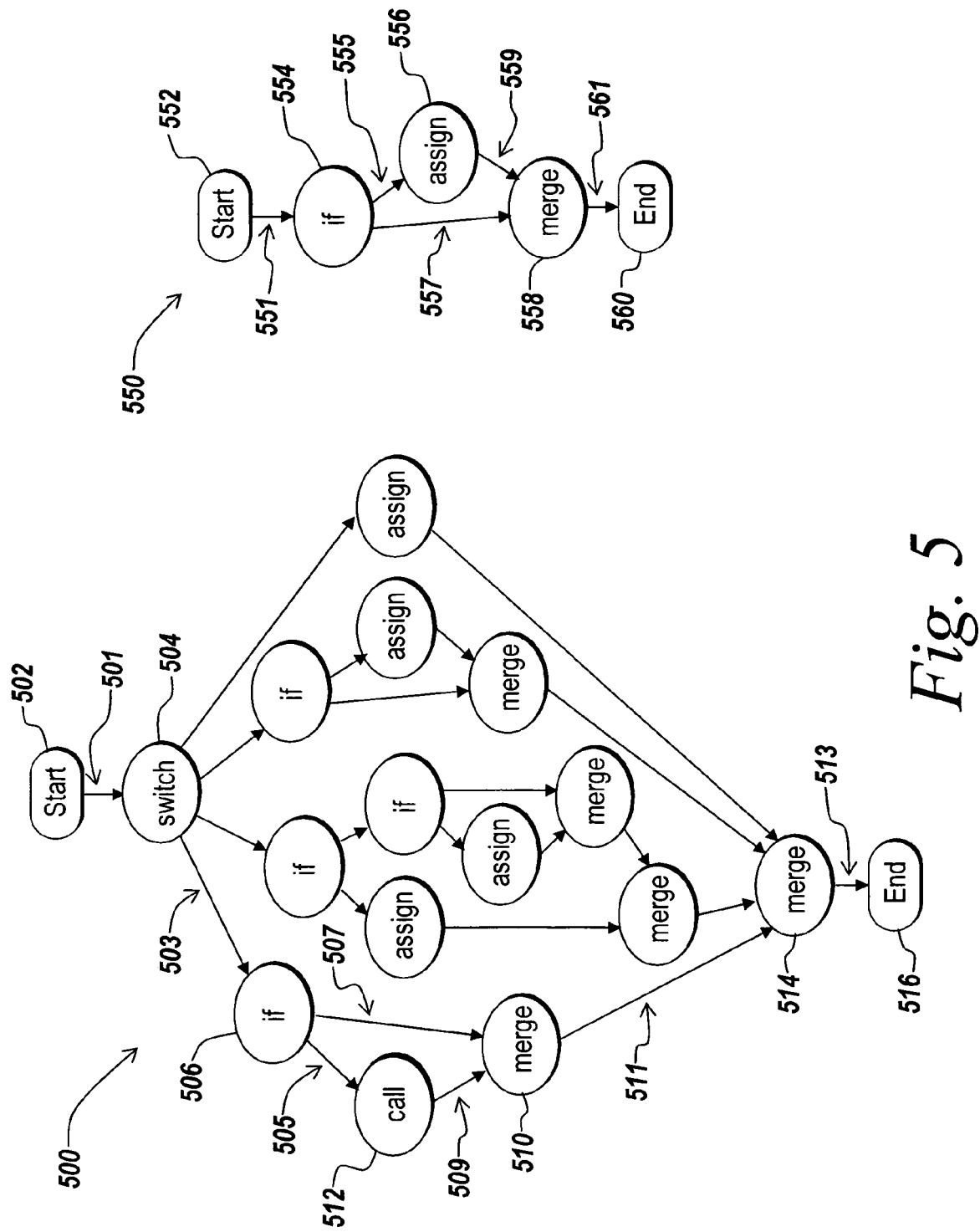
FIG. 5 is an example of a control flow graph of an intermediate representation generated from a constructor general transformer.

FIG. 5 depicts an example of control flow graphs of the intermediate representation that are generated by the construction and general transformation phases of the code generation process. Control flow graph 500 includes multiple nodes and edges and represents a single function. A flow path of control flow graph 500 begins at start node 502 and flows into conditional node 504 through edge 501. The flow path of the control flow graph 500 following conditional node 504 is determined by satisfying a condition of the conditional node. For example, conditional node 504 may flow to conditional node 506 through edge 503. Conditional node 506 provides an evaluation of a condition. If the condition is false the control flow graph 500 flows to merge node 510 through edge 507. Merge node 510 merges the paths that conditional node 506 provides. If the condition is true the control flow graph 500 flows to call node 512 through edge 505. Call node 512 provides a function call to control flow graph 550, which represents a function provided in the call node 512.

The flow path of control flow graph 550 begins with start node 552, which flows into conditional node 554 through edge 551. Conditional node 554 provides an evaluation of a condition. If the condition is false the control flow graph 550 flows to merge node 558 through edge 557. If the condition is true the control flow graph 550 flows to assign node 556 through edge 555. Assign node 556 provides assignment of a value to a variable and may be based on an algebraic equation. The assign node flows to merge node 558 through edge 559. Merge node 558 flows into end node 560 through edge 561. End node 560 of control flow graph 550 flows back to call node 512 of control flow graph 550. Control flow graph 550 may or may not return a value to control flow graph 500. The flow then continues from call node 512 to merge node 510 through edge 509. Merge node 510 then flows to merge node 514 through edge 511. Finally, merge node 514 flows to end node 516 through edge 513.

Referring back to FIGS. 3A-K, the backend phase of the code generation process outputs a hardware description language that represents the state diagram using the backend 306 (Step 340). The backend phase includes four phases, a conformance checking phase that uses conformance checker 301 (Step 350), a type checking phase that uses type checker 303 (Step 360), a hardware description language specific transformation phase that uses the specific transformer 305 ("specific transformation phase") (Step 370), and a hardware description language generation phase code generator 307 ("generation phase") (Step 390).

The conformance checking phase of the backend phase checks the intermediate representation that was generated from the general transformation phase for conformance to a set of predefined restrictions (Step 352). The set of predefined restrictions ensure that the intermediate representation does not contain constructs that are unsupported by a hardware description language. In the event that the intermediate representation does not conform to the set of predefined restrictions, the backend phase notifies the user by providing a message that explains the errors (Step 354).

To enable the conversion from a state diagram to a hardware description language the set of predefined restrictions are used. This is because of the difference in modeling scope and language constructs between a hardware description language and the intermediate representation generated by the general transformation phase.

To ensure that the state diagram semantics can be described completely in the hardware description language's semantics, unstructured flow graphs are prohibited. Hardware description languages operate in a logical sequence and therefore do not use unstructured flow graphs. An example of an unstructured flow graph is one that uses a GO_TO command. The GO_TO command provides an instruction in programming languages that causes the program to jump to another point in the program that is specified by the GO_TO command.

Figure 4A:
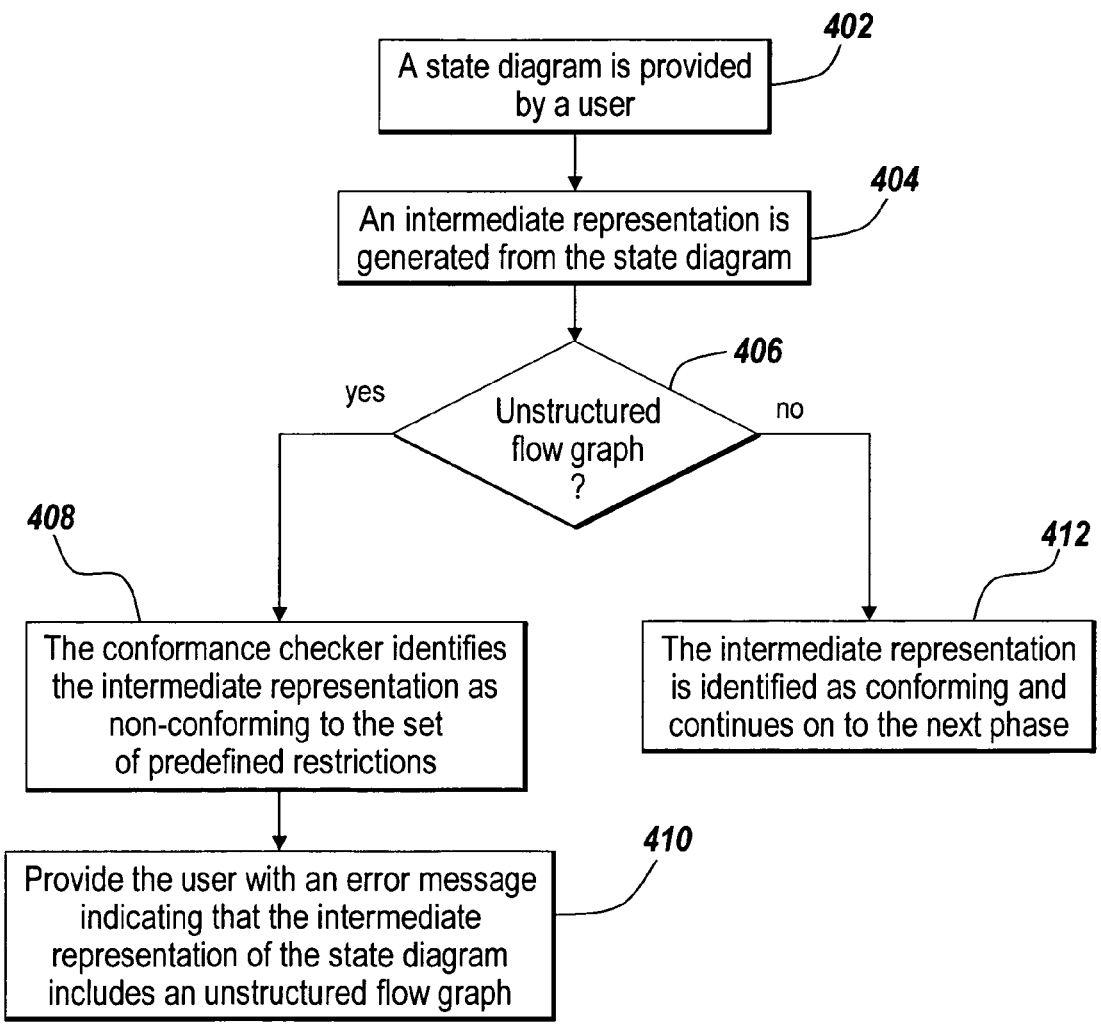
FIG. 4A is a flow diagram for implementing the process of restricting unstructured flow graphs using a set of predefined restrictions.

FIG. 4A is a flow diagram for implementing the process of restricting unstructured flow graphs using the set of predefined restrictions. A state diagram is provided by a user (Step 402), and an intermediate representation is generated from the state diagram (Step 404). The conformance checker phase of the backend phase determines if the intermediate representation includes an unstructured flow graph (Step 406). If the intermediate representation includes an unstructured flow graph, the conformance checker phase identifies the intermediate representation as non-conforming to the set of predefined restrictions (Step 408), and provides the user with an error message indicating that the intermediate representation of the state diagram includes an unstructured flow graph (Step 410). If, however, the intermediate representation conforms to the set of predefined restrictions, that is, does not include an unstructured flow graph, the intermediate representation is identified as conforming and continues on to the next phase (Step 412).

Further, no recursive functions may be used. A recursive function is a function that may call itself to repeatedly process an output of the function. The elimination of recursive functions ensures that the intermediate representation only includes functions that can be placed inline.

Figure 4B:
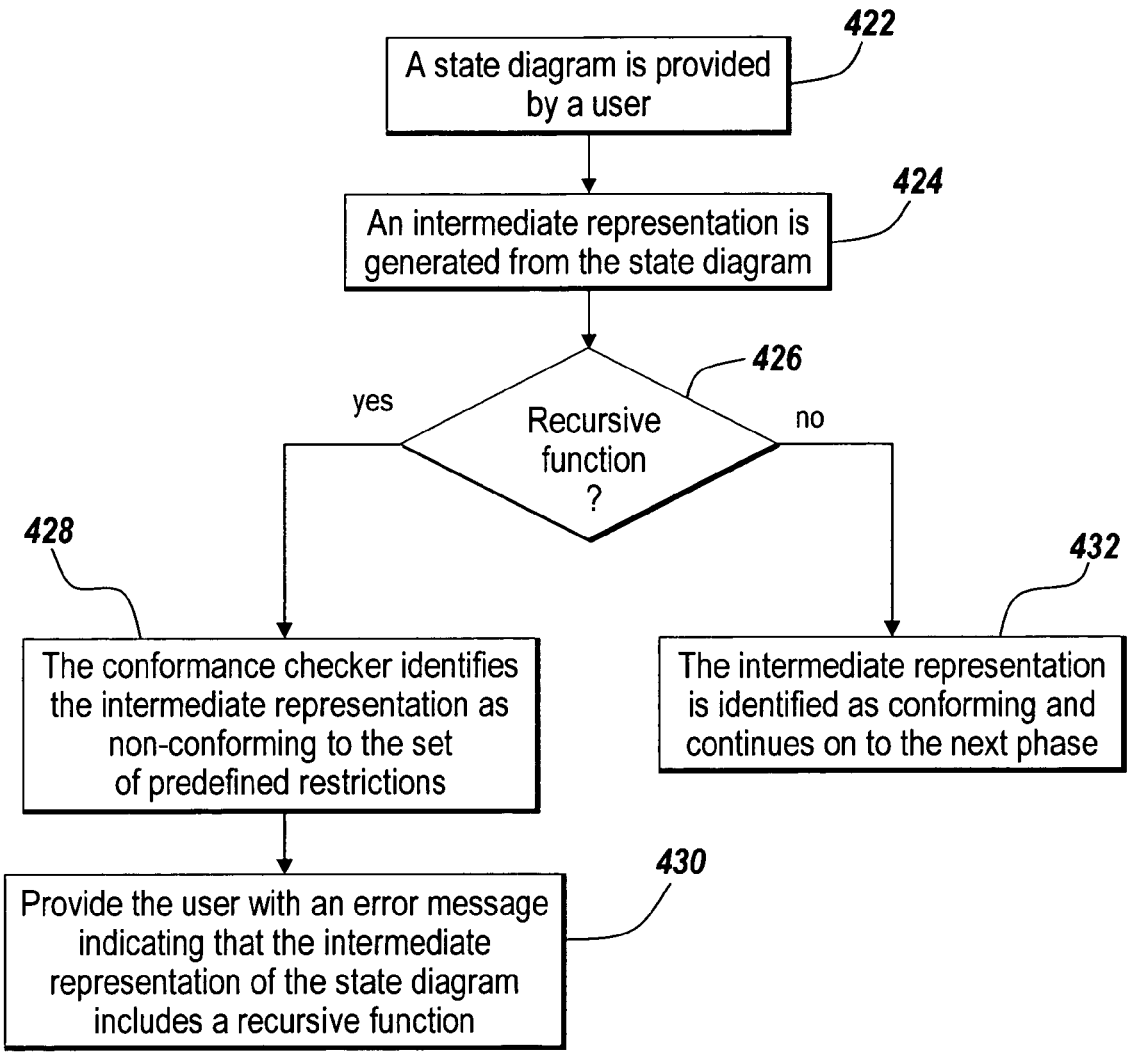
FIG. 4B is a flow diagram for implementing the process of restricting recursive functions using a set of predefined restrictions.

FIG. 4B is a flow diagram for implementing the process of restricting recursive function using the set of predefined restrictions. A state diagram is provided by a user (Step 422), and an intermediate representation is generated from the state diagram (Step 424). The conformance checker phase of the backend phase determines if the intermediate representation includes a recursive function (Step 426). If the intermediate representation includes a recursive function, the conformance checker phase identifies the intermediate representation as non-conforming to the set of predefined restrictions (Step 428), and provides the user with an error message indicating that the intermediate representation of the state diagram includes a recursive function (Step 430). If, however, the intermediate representation conforms to the set of predefined restrictions, that is, the intermediate representation does not include recursive functions; the intermediate representation is identified as conforming and continues on to the next phase (Step 432).

The set of restrictions also may prohibit computations in default transitions. A default transition for a finite state machine described by a hardware description language does not provide any computations. Default transitions in the state diagramming environment specify which exclusive (OR) state is to be active when there is ambiguity between two or more exclusive (OR) states at the same level in the hierarchy. The default transition in hardware description languages represents the initial transition for a finite state machine is initially executed, and may be used for resetting the finite state machine to a default state.

Figure 4C:
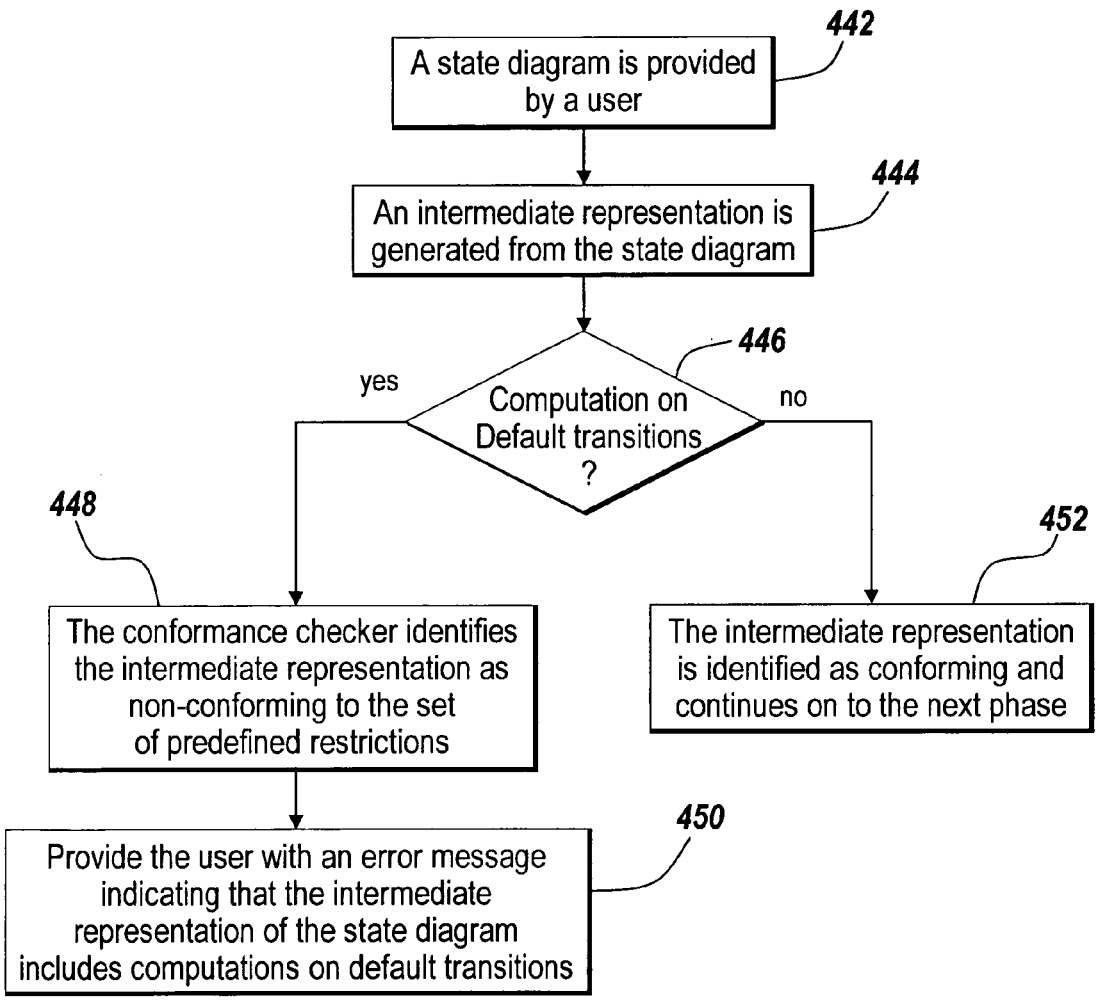
FIG. 4C is a flow diagram for implementing the process of restricting custom C code using a set of predefined restrictions.

FIG. 4C is a flow diagram for implementing the process of restricting computations on default transitions using the set of predefined restrictions. A state diagram is provided by a user (Step 442), and an intermediate representation is generated from the state diagram (Step 444). The conformance checker phase of the backend phase determines if the intermediate representation includes computations on default transitions (Step 446). If the intermediate representation includes computations on default transitions the conformance checker phase identifies the intermediate representation as non-conforming to the set of predefined restrictions (Step 448), and provides the user with an error message indicating that the intermediate representation of the state diagram includes computations on default transitions (Step 450). If, however, the intermediate representation conforms to the set of predefined restrictions, that is, the intermediate representation does not include computations on default transitions; the intermediate representation continues on to the next phase (Step 452).

Another restriction that may be implemented is eliminating machine-parented events and data. Machine-parented events and data are events and data that are generated at the highest level of the state diagram hierarchy. As such, these machine-parented events and data are separate from the state diagram. Hardware description languages do not use these constructs, and therefore these constructs are prohibited using the set of predefined restrictions.

Figure 4D:
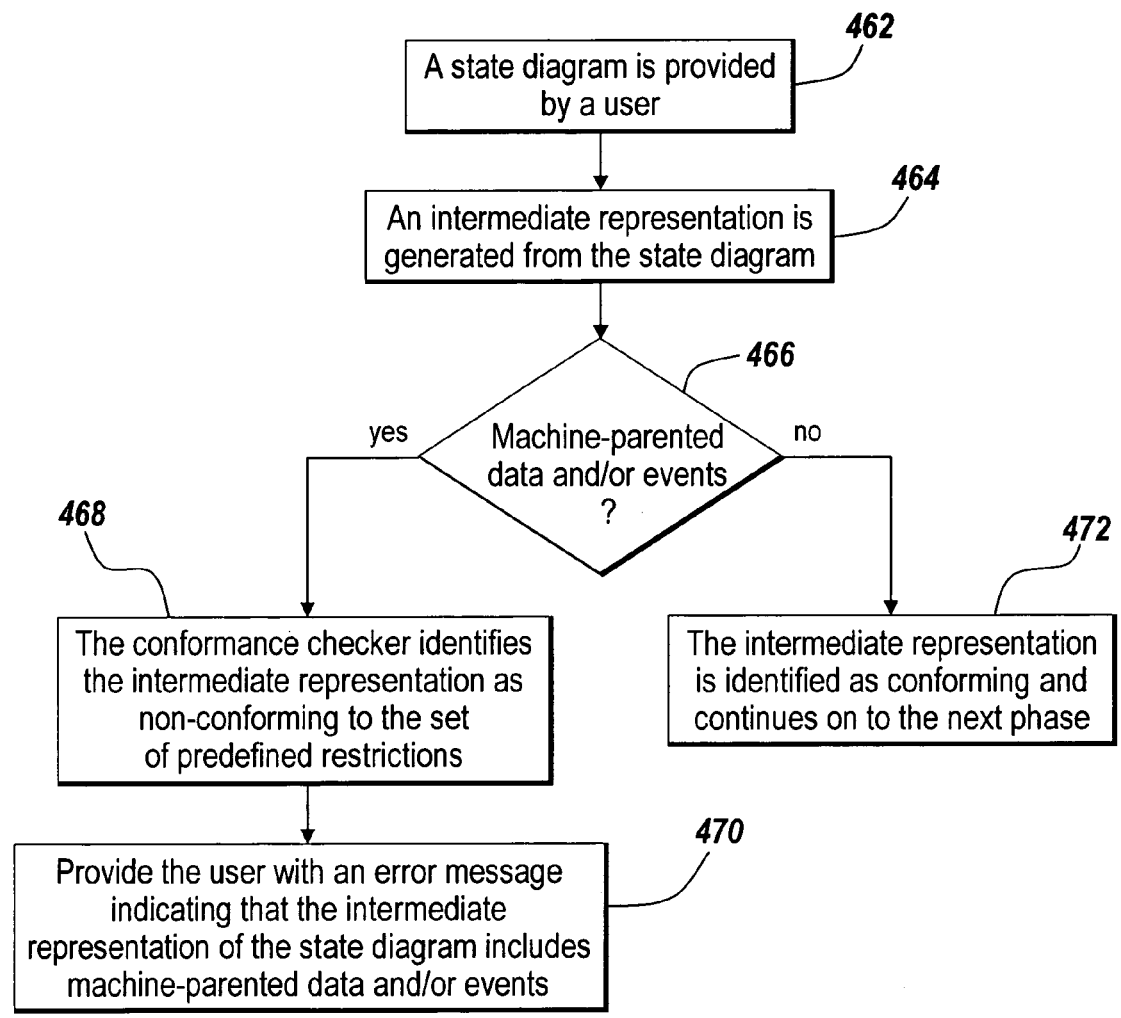
FIG. 4D is a flow diagram for implementing the process of restricting machine-parented data and events using the set of predefined restrictions.

FIG. 4D is a flow diagram for implementing the process of restricting machine-parented data and events using the set of predefined restrictions. A state diagram is provided by a user (Step 462), and an intermediate representation is generated from the state diagram (Step 464). The conformance checker phase of the backend phase determines if the intermediate representation includes machine-parented data and/or events (Step 466). If the intermediate representation includes machine-parented data and/or events the conformance checker phase identifies the intermediate representation as non-conforming to the set of predefined restrictions (Step 468), and provides the user with an error message indicating that the intermediate representation of the state diagram includes machine-parented data and/or events (Step 470). If, however, the intermediate representation conforms to the set of predefined restrictions, that is, the intermediate representation does not include machine-parented data and/or events; the intermediate representation continues on to the next phase (Step 472).

Another restriction that may be implemented is that all loops must have a static bound. That is, all loops must have a finite number of cycles. An example of a construct that is a loop that has a static bound is a for loop.

Figure 4E:
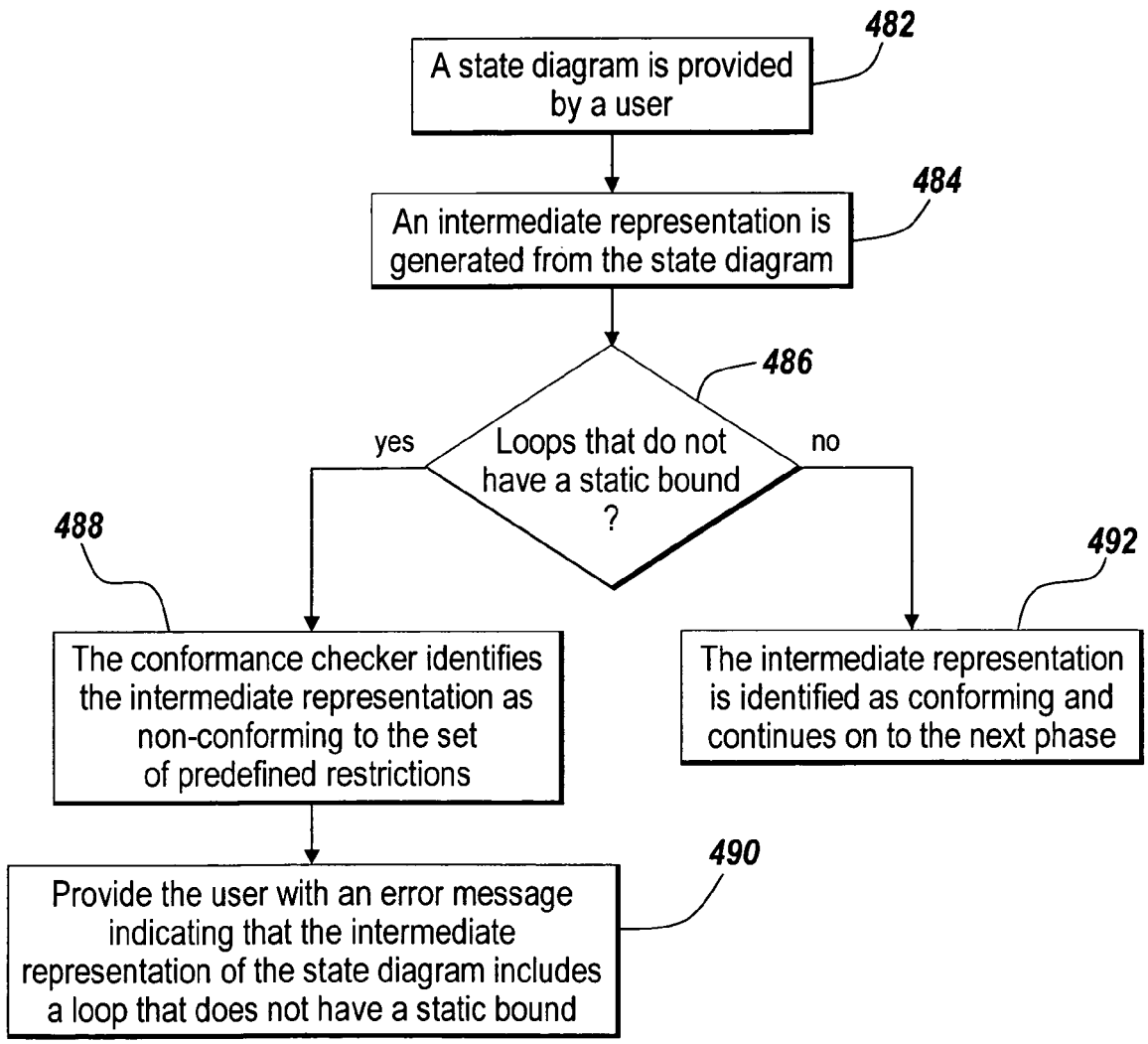
FIG. 4E is a flow diagram for implementing the process of restricting loops to have a static bound using the set of predefined restrictions.

FIG. 4E is a flow diagram for implementing the process of restricting loops to have a static bound using the set of predefined restrictions. A state diagram is provided by a user (Step 482), and an intermediate representation is generated from the state diagram (Step 484). The conformance checker phase of the backend phase determines if the intermediate representation includes a loop that do not have a static bound (Step 486). If the intermediate representation includes a loop that do not have a static bound the conformance checker phase identifies the intermediate representation as non-conforming to the set of predefined restrictions (Step 488), and provides the user with an error message indicating that the intermediate representation of the state diagram includes a loop that does not have a static bound (Step 490). If, however, the intermediate representation conforms to the set of predefined restrictions, that is, the intermediate representation includes only loops that have a static bound; the intermediate representation continues on to the next phase (Step 492).

Referring again to FIGS. 3A-K, the type checking phase examines each variable and operator of the intermediate representation to eliminate unnecessary type casts (Step 362) and to add necessary type casts (Step 364). For example, the intermediate representation generated by the general transformation stages may include a type cast appropriate for use with C code, but not for hardware description languages. The intermediate representation may include, for example, a type cast that casts an 8-bit integer to a 32-bit integer. This type cast would be used for code generation in the C programming language, but is not necessary to generate code in a hardware description language. Therefore, the type checking phase eliminates these type casts.

Further, the type checking phase adds casts that are necessary for generating code for a hardware description language. An example of a cast that is necessary for the hardware description language of VHDL is the "std_logic", which is used to incorporate standard logic types.

The type checking phase ensures bit-true compatibility between the hardware description language that the backend phase generates and the simulation result of the state diagram in the state diagramming environment. As a result, a state diagram simulated in the state diagramming environment produces identical results as a simulation of a hardware description language representation of the state diagram.

The specific transformation phase of the backend phase lowers the intermediate representation generated by the general transformation phase to provide an intermediate representation that enables conversion of the intermediate representation into a hardware description language. This is achieved by transforming the structure of the intermediate representation into a structure that is similar to a hardware description language structure. For example, a finite state machine may be represented by a hardware description language code that has two processes. A process in a hardware description language is similar to a function program in a programming language. The first process may be referred to as an output process and the second process may be referred to as an update process.

As discussed above, the intermediate representation generated by the general transformation phase may provide control flow graphs for each function contained in the state diagram. In one embodiment, the state diagramming environment transforms the intermediate representation into a hardware description language specific intermediate representation the specific transformation phase by placing all of the functions inline to yield a single function (Step 372). Creating a single function transforms the control flow graph of the intermediate representation into a single structure that is compatible with the output process of a hardware description language representation of a finite state machine.

The general transformation phase may also optimize the intermediate representation. In one example, the general transformation phase may optimize the intermediate representation by using expression folding and constant propagation. Expression folding refers to reducing multiple expressions to a single expression. Constant propagation refers to replacing variables that reference a constant with the constant. In another example, the general transformation phase may expand on the number of expressions and allow the expanded expressions to be executed in parallel. The general transform may also expand a complicated expression, such as an iterator, into a bunch of simpler equations that are equivalent. As a result of the optimizations, the time necessary to execute the intermediate representation as well as the generated hardware description language representation of the state diagram may be reduced. Further, the optimizations may reduce the memory size of the intermediate representation or the hardware description language representation of the state diagram.

Figure 6:
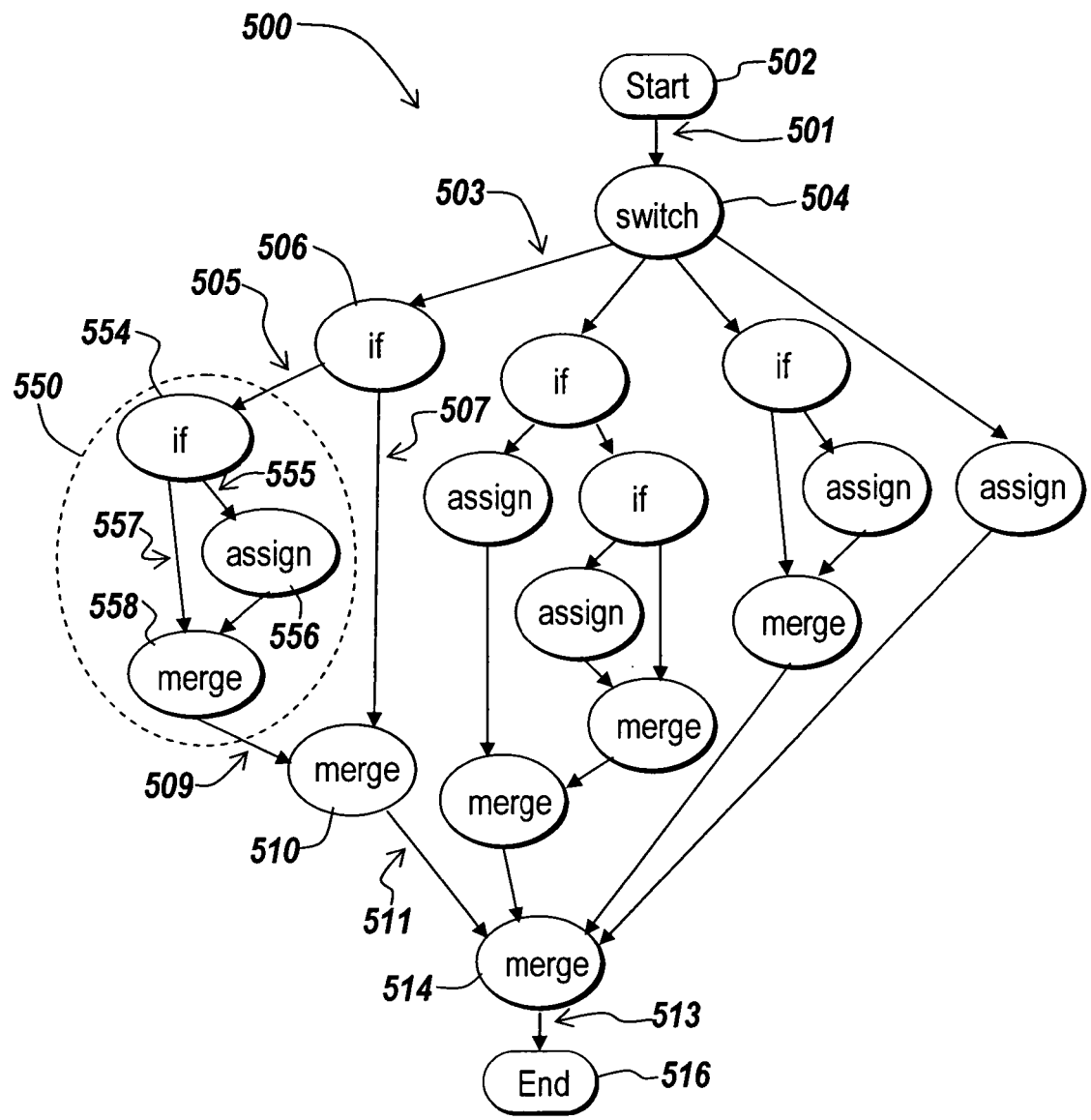
FIG. 6 is an example of a control flow graph of a hardware description language specific intermediate representation that is generated from a specific transformer.

FIG. 6 depicts an example of a single control flow graph generated by the specific transformation phase based by placing inline the control flow graphs of FIG. 5. As discussed above, the specific transformation phase transforms the control flow graph of the intermediate representation generated by the general transformation phase into a single control flow graph. To achieve this, the specific transformation phase places the control flow graph 550 inline with the control flow graph 500. In this manner, the specific transformation phase replaces call node 512 with the entire control flow graph 550.

The specific transformation phase further enables transforming the intermediate representation into a structure that is similar to the structure of a two-process hardware description language representation of a finite state machine by creating a second function to represent the update process (Step 374). The specific transformation stage provides several steps to transform the intermediate representation into a hardware description language format. To begin, a set of temporary variables are created to hold the current value of state variables and local variables, which are mapped to registers in hardware (Step 376). The temporary variables are used in the computation of the operations of the intermediate representation of the state diagram (Step 378). Every occurrence of the original state variables or local variables is replaced by the temporary variables (Step 380). Upon completion of the computations, the temporary variables are assigned to a new set of variables, called next variables, that hold the "next" value of the state and local variables (Step 382). In addition, a new update function is added to the intermediate representation (Step 384). The next variables are assigned to the current state and local variables to update them (Step 386). After these steps, the new two-function intermediate representation can be mapped to a two-process hardware description language representation of a finite state machine.

Although the intermediate representation is illustrated in FIGS. 5 and 6 to include control flow graphs, one ordinarily skilled in the art will recognize and appreciate that any type and/or form of suitable graph or intermediate representation may be used in practicing the techniques of the present invention described herein. For example, in some embodiments, a directed graph or a tree structure graph be used. As such, the intermediate representation may comprise constructs and elements, graphical or otherwise, relevant to the type and/or form of intermediate representation. One ordinarily skilled in the art will recognize and appreciate how the techniques of the present invention described herein would be applied using an intermediate representation provided in a form other than as illustrated in FIGS. 5 and 6.

The intermediate representations generated by the code generation process may be simulated to provide information for verifying and debugging the state diagram prior to generating the hardware description language representation of the state diagram. In this manner, the state diagramming environment may provide a user with information to enable the user to determine if the state diagram functions as the user desires.

Referring again to the code generation process depicted in FIGS. 3A-K, the generation phase replaces the intermediate representation with a specific hardware description language, such as VHDL or Verilog. To achieve this, the syntax and semantics of the state diagram are mapped to the syntax and semantics of the specific hardware description language (Step 392). For example, when a key word used in the specific hardware description language does not match a key word used in the intermediate representation, the appropriate key word used in the specific hardware description language replaces the key word found in the intermediate representation. As an example, a key word in the intermediate representation may be "switch," while the key word in a hardware description language is "case." In this example, the generation phase replaces the keyword "switch" with the key word "case." The generation phase also adds standard interface signals (Step 394), which include a clock signal, a clock enable signal and a reset signal. These signals are used in a hardware description language representation of a finite state machine to control the operation of the finite state machine.

The generated hardware description representation of the state diagram may be implemented in an FPGA, programmable logic devices (PLCs) or any other devices allow configuration or reconfiguration of inputs, outputs and logic structures. As a result a user may configure and/or reconfigure signal conditioning input/output devices. This also enables a user who develops a state diagram to implement the state diagram with off the shelf components.

The present invention may be provided as one or more computer-readable programs embodied on or in one or more mediums. The mediums may be, but are not limited to a floppy disk, a hard disk, a compact disc, a digital versatile disc, a flash memory card, a PROM, a RAM, a ROM, FPGA, ASIC or a magnetic tape. In general, the computer-readable programs may be implemented in any programming language. Some examples of languages that can be used include C, C++, C#, JAVA, or HDL. The software programs may be stored on or in one or more mediums as object code.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A computer-readable medium that stores instructions executable by at least one processor, the computer-readable medium comprising:
   one or more instructions for interacting with a state diagram in a state diagramming environment;
   one or more instructions for generating an intermediate representation of the state diagram based on information in the state diagram;
   one or more instructions for identifying one or more type casts associated with the intermediate representation;
   one or more instructions for transforming the intermediate representation of the state diagram into a lower-level representation of the state diagram; and
   one or more instructions for generating a hardware description language representation of the state diagram based on the lower-level representation.

2. The computer-readable medium of claim 1, further comprising:
   one or more instructions for providing a graphical state diagram in a graphical state diagram environment, where the graphical state diagram includes at least one state.

3. The computer-readable medium of claim 1, where the information included in the state diagram comprises textual action language statements representing state transition actions and conditions in the state diagram, and where the one or more instructions for generating an intermediate representation of the state diagram further comprise:
   one or more instructions for parsing the textual action language statements from the state diagram; and
   one or more instructions for generating the intermediate representation based on the textual action language statements.

4. The computer-readable medium of claim 3, where the one or more instructions for parsing the textual action language statements from the state diagram further comprise:

one or more instructions for generating a set of abstract syntax trees based on the parsed textual action language statements, and
where the one or more instructions for generating the intermediate representation based on the textual action language statements further comprise:
one or more instructions for generating the intermediate representation based on the set of abstract syntax trees.

5. The computer-readable medium of claim 1, where the intermediate representation comprises a preliminary intermediate representation, the computer-readable medium further comprising:
one or more instructions for generating a second intermediate representation based on the preliminary intermediate representation; and
one or more instructions for generating source code in a programming language based on the state diagram using the second intermediate representation.

6. The computer-readable medium of claim 5, further comprising:
one or more instructions for generating a third intermediate representation based on the preliminary intermediate representation, where the third intermediate representation supports generation of hardware description language based on the state diagram; and
one or more instructions for transforming the third intermediate representation of the state diagram into the lower-level representation of the state diagram.

7. The computer-readable medium of claim 1, where the intermediate representation comprises at least one control flow graph representing a function provided by the state diagram, where the control flow graph includes at least one node.

8. The computer-readable medium of claim 7, where the one or more instructions for transforming the intermediate representation further comprise:
one or more instructions for converting the at least one node in the control flow graph into an expression tree node; and
one or more instructions for converting high level types in the intermediate representation into explicit for-loops.

9. The computer-readable medium of claim 1, where the one or more instructions for generating a hardware description language representation of the state diagram further comprise:
one or more instructions for checking the lower-level representation of the state diagram for compliance with restrictions associated with generating the hardware description language representation.

10. The computer-readable medium of claim 9, where the restrictions include at least one of: no unstructured flow graphs, no recursive functions, no computations on default transitions, no machine-parented events and data, or no unbounded loops.

11. The computer-readable medium of claim 1, where the one or more instructions for generating a hardware description language representation of the state diagram further comprise:
one or more instructions for removing identified type casts that are unnecessary for generating the hardware description language representation of the state diagram.

12. The computer-readable medium of claim 11, further comprising:
one or more instructions for adding one or more type casts to the intermediate representation for use in generating the hardware description language representation.

13. The computer-readable medium of claim 1, where the one or more instructions for generating a hardware description language representation of the state diagram further comprise:
one or more instructions for transforming the lower-level representation of the intermediate representation into a hardware description language intermediate representation.

14. The computer-readable medium of claim 13, where the one or more instructions for transforming the lower-level representation of the intermediate representation into a hardware description language intermediate representation further comprise:
one or more instructions for converting a plurality of functions contained in the state diagram into a single function compatible with generating the hardware description language representation.

15. The computer-readable medium of claim 13, further comprising:
one or more instructions for replacing syntax of the hardware description language intermediate representation with hardware description language syntax.

16. A state diagram modeling system, comprising:
a parser to identify syntactical components of a state diagram;
an intermediate representation generator to generate an intermediate representation of the state diagram based on the identified syntactical components;
a transformer to transform the intermediate representation of the state diagram into a lower-level representation of the state diagram; and
a backend to generate and output a hardware description language representation of the state diagram, where the backend further comprises:
a conformance checker to identify conformance of the intermediate representation with a set of predefined restrictions associated with generating the hardware description language representation,
a type checker to ensure bit-true compatibility between the hardware description language representation and a simulation result of the state diagram,
a second transformer to transform the lower-level representation of the state diagram into a hardware description language intermediate representation, and
a code generator to generate the hardware description language representation based on the hardware description language intermediate representation.

17. The system of claim 16, where the intermediate representation comprises at least one control flow graph representing a function provided by the state diagram, where the control flow graph includes at least one node, the transformer further configured to:
convert the at least one node in the control flow graph into an expression tree node; and
convert high level types in the intermediate representation into explicit for-loops.

18. The system of claim 16, where the transformer is further configured to:
optimize the intermediate representation to decrease at least one of an execution time or memory size of at least one of the intermediate representation or the hardware description language representation.

19. The system of claim 16, where the second transformer is further configured to identify functions included within the lower-level representation of the state diagram and convert the identified functions into a single function.

20. A computing device-implemented method, comprising:
- interacting with a state diagram;
- generating an intermediate representation of the state diagram based on information included in the state diagram;
- identifying one or more type casts associated with the intermediate representation;
- transforming the intermediate representation of the state diagram into a lower-level representation of the state diagram; and
- generating a hardware description language representation of the state diagram based on the lower-level representation.

21. The method of claim 20, further comprising:
- parsing syntax included in the state diagram; and
- generating the intermediate representation based on the parsed syntax.

22. The method of claim 20, where the intermediate representation comprises at least one control flow graph representing a function provided by the state diagram, where the control flow graph includes at least one node, and where transforming the intermediate representation further comprises:
- converting the at least one node in the control flow graph into an expression tree node; and
- converting vectors and matrixes included within the intermediate representation into explicit for-loops.

23. The method of claim 20, where generating the hardware description language representation further comprises:
- identifying conformance of the intermediate representation with a set of predefined restrictions associated with generating the hardware description language representation;
- ensuring bit-true compatibility between the hardware description language representation and a simulation result of the state diagram;
- transforming the lower-level representation of the state diagram into a hardware description language intermediate representation; and
- generating the hardware description language representation based on the hardware description language intermediate representation.

24. A computing device-implemented method, comprising:
- interacting with a graphical state diagram in a graphical state diagramming environment, where the graphical state diagram includes syntax and semantics to generate code;
- generating an intermediate representation of the state diagram based on syntax and semantics of the graphical state diagram;
- identifying one or more type casts associated with the intermediate representation;
- mapping the semantics of the intermediate representation to semantics of a hardware description language; and
- generating code in the hardware description language based on the mapping of the semantics of the intermediate representation to semantics of the hardware description language.

* * * * *